(12) United States Patent
Chen et al.

(10) Patent No.: US 12,550,408 B2
(45) Date of Patent: Feb. 10, 2026

(54) CONNECTION BETWEEN GATE AND SOURCE/DRAIN FEATURE

(71) Applicant: TAIWAN SEMICONDUCTOR MANUFACTURING COMPANY, LTD., Hsinchu (TW)

(72) Inventors: Jui-Lin Chen, Taipei (TW); Chao-Hsun Wang, Taoyuan County (TW); Hsin-Wen Su, Hsinchu (TW); Yi-Feng Ting, Taipei (TW); Chi Hua Wang, New Taipei (TW); I-Hung Li, New Taipei (TW); Yuan-Tien Tu, Chiayi County (TW); Fu-Kai Yang, Hsinchu (TW); Mei-Yun Wang, Hsin-Chu (TW); Ping-Wei Wang, Hsin-Chu (TW); Lien Jung Hung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 696 days.

(21) Appl. No.: 17/832,597

(22) Filed: Jun. 4, 2022

(65) Prior Publication Data
US 2023/0197802 A1 Jun. 22, 2023

Related U.S. Application Data

(60) Provisional application No. 63/290,391, filed on Dec. 16, 2021.

(51) Int. Cl.
*H10D 64/23* (2025.01)
*H10D 30/67* (2025.01)
(Continued)

(52) U.S. Cl.
CPC ......... *H10D 64/258* (2025.01); *H10D 84/017* (2025.01); *H10D 84/0184* (2025.01);
(Continued)

(58) Field of Classification Search
CPC ............... H10D 64/258; H10D 84/017; H10D 84/0184; H10D 84/0193; H10D 84/038;
(Continued)

(56) References Cited

U.S. PATENT DOCUMENTS 8,772,109 B2  7/2014  Colinge
8,785,285 B2  7/2014  Tsai et al.
(Continued)

FOREIGN PATENT DOCUMENTS

CN  113540081 A  10/2021

*Primary Examiner* — Britt D Hanley
*Assistant Examiner* — Casey Paul Boatman
(74) *Attorney, Agent, or Firm* — HAYNES AND BOONE, LLP

(57) ABSTRACT

A method according to the present disclosure includes forming a fin-shaped structure protruding from a substrate, forming a gate structure intersecting the fin-shaped structure, forming a gate spacer on a sidewall of the gate structure, and forming a conductive feature above the fin-shaped structure. The gate spacer is laterally between the gate structure and the conductive feature. The method also includes depositing a dielectric layer over the gate structure and the conductive feature, performing an etching process, thereby forming an opening through the dielectric layer and exposing top surfaces of the conductive feature and the gate structure, recessing the gate spacers through the opening, thereby exposing the sidewall of the gate structure, and forming a contact feature in the opening, wherein the contact feature is in contact with the conductive feature and has a bottom portion protruding downward to be in contact with the sidewall of the gate structure.

20 Claims, 28 Drawing Sheets

(51) Int. Cl.
*H10D 62/10* (2025.01)
*H10D 84/01* (2025.01)
*H10D 84/03* (2025.01)
*H10D 84/83* (2025.01)

(52) U.S. Cl.
CPC ....... *H10D 84/0193* (2025.01); *H10D 84/038* (2025.01); *H10D 84/834* (2025.01); *H10D 30/6735* (2025.01); *H10D 30/6757* (2025.01); *H10D 62/118* (2025.01)

(58) Field of Classification Search
CPC ............. H10D 84/834; H10D 30/6735; H10D 30/6757; H10D 62/118
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2016/0111430 A1* | 4/2016 | Liaw ................ H01L 21/76897 438/283 |
| 2017/0053827 A1* | 2/2017 | Wang ................ H10D 84/0149 |
| 2017/0229341 A1* | 8/2017 | Chang ................ H01L 23/528 |
| 2021/0202498 A1* | 7/2021 | Liaw ................ H10D 64/017 |
| 2021/0305262 A1 | 9/2021 | Wang et al. |
| 2021/0376093 A1 | 12/2021 | Chu et al. |
| 2022/0037340 A1* | 2/2022 | Yang ................ H01L 21/02126 |

\* cited by examiner

CONNECTION BETWEEN GATE AND SOURCE/DRAIN FEATURE

PRIORITY

This non-provisional application claims priority to U.S. Provisional Patent Application Ser. No. 63/290,391, filed on Dec. 16, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor.

In some IC circuits where multi-gate devices are implemented, a connection between a gate structure and a source/drain feature may be realized by various contact structures. For example, a gate contact to the gate structure may be coupled to a source/drain contact to the source/drain feature via a butted contact. With ever-decreasing device sizes, a butted contact suffers from limited contact surfaces for connection between a gate structure and a source/drain contact, which may lead to high contact resistance. Additionally, a butted contact is not self-aligned and requires high overlay accuracy during lithography steps, which may translate into increased cost. Therefore, while conventional gate-to-source/drain connections are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
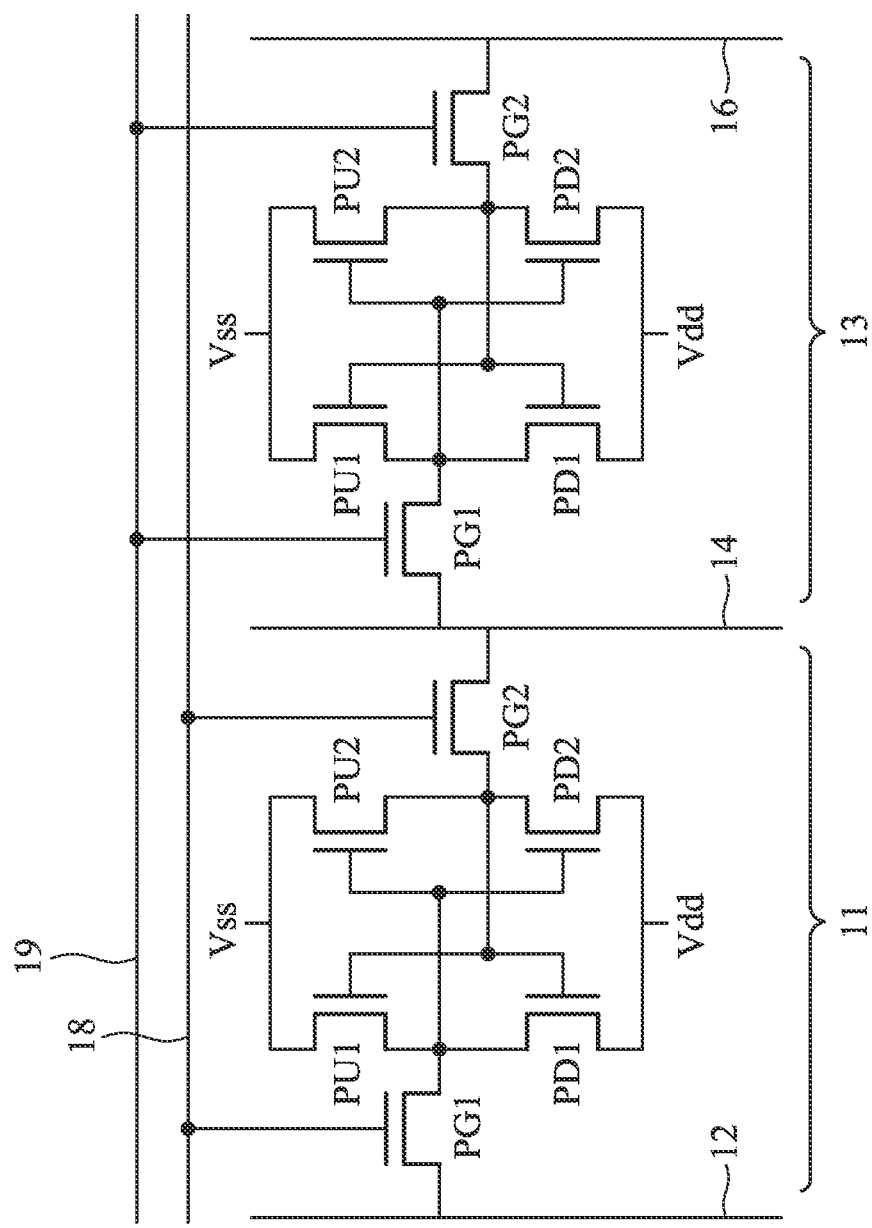
FIG. 1 illustrates a circuit diagram of a set of memory cells, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to a contact structure among multi-gate devices, and more particularly to a connection between a gate structure and a source/drain feature.

IC manufacturing process flow may be typically divided into three categories: front-end-of-line (FEOL) processes, middle-end-of-line (MEOL) processes, and back-end-of-line (BEOL) processes. FEOL processes generally encompasses processes related to fabricating IC devices, such as transistors. For example, FEOL processes may include forming isolation features, gate structures, and source/drain features. MEOL processes generally encompasses processes related to fabricating contacts to conductive features of the IC devices, such as contacts to the gate structures and/or the source/drain features. BEOL processes generally encompasses processes related to fabricating a multilayer interconnect (MLI) feature that interconnects IC features fabricated by FEOL and MEOL process, thereby enabling operation of the IC devices. Features fabricated by FEOL processes may be referred to as FEOL features. Features fabricated by MEOL processes may be referred to as MEOL features. Features fabricated by BEOL processes may be referred to as BEOL features.

Some IC devices include a connection between FEOL structures. For example, some static random access memory (SRAM) cells include a connection between a gate structure of one transistor to a source/drain feature of another transistor. MEOL or even BEOL contact features, such as butted contacts, are fabricated to achieve such a connection.

FIG. 1 is a circuit diagram showing an illustrative set of SRAM cells. According to the present example, FIG. 1 illustrates the circuit diagrams for two adjacent memory cells 11, 13. The first memory cell 11 is connected to a first bit line 12 and a second bit line 14. In one example, the first bit line is BL and the second bit line is BLB. Additionally, the first memory cell 11 is connected to word line 18, but is not connected to word line 19. Thus, while both word lines 18, 19 are associated with the row in which the memory cells 11, 13 are positioned, the first memory cell 11 is only connected to one of the two word lines.

In more detail the first memory cell 11 connects to the first bit line 12 through the source of a first pass gate transistor PG1. The gate of the pass gate transistor PG1 is connected to the first word line 18. The drain of the pass gate transistor PG1 connects to the drain of a first pull-up transistor PU1, a source of a first pull-down transistor PD1, the gate of a second pull-up transistor PU2, and the gate of a second pull-down transistor PD2. The source of the pull-up transistor PU1 is connected to Vss and the drain of the pull-down transistor PD1 is connected to Vdd. Similarly, the source of the pull-up transistor PU2 is connected to Vss and the drain of the pull-down transistor PD2 is connected to Vdd. Furthermore, the gate of the pull-up transistor PU1, the gate of the pull-down transistor PD1, the drain of the pull-up transistor PU2, and the source of the pull-down transistor PD2 are all connected to the source of a second pass-gate transistor PG2. The gate of the second pass-gate transistor PG2 is also connected to the word line 18. The drain of the pass-gate transistor PG2 is connected to the second bit line 14. The second memory cell 13 is connected to bit line 14, which is shared with the first memory cell. The second memory cell 13 is also connected to another bit line 16. In this example, bit line 14 is BLB and bit line 16 is BL. Additionally, the second memory cell 13 is connected to word line 19, but is not connected to word line 18. Thus, while both word lines 18, 19 are associated with the row in which the memory cells 11, 13 are positioned, the second memory cell 13 is only connected to one of the two word lines.

In more detail the second memory cell 13 connects to the bit line 14 through the source of a first pass gate transistor PG1. The gate of the pass gate transistor PG1 is connected to the second word line 19. The drain of the pass gate transistor PG1 connects to the drain of a first pull-up transistor PU1, a source of a first pull-down transistor PD1, the gate of a second pull-up transistor PU2, and the gate of a second pull-down transistor PD2. The source of the pull-up transistor PU1 is connected to Vss and the drain of the pull-down transistor PD1 is connected to Vdd. Similarly, the source of the pull-up transistor PU2 is connected to Vss and the drain of the pull-down transistor PD2 is connected to Vdd. Furthermore, the gate of the pull-up transistor PU1, the gate of the pull-down transistor PD1, the drain of the pull-up transistor PU2, and the source of the pull-down transistor PD2 are all connected to the source of a second pass-gate transistor PG2. The gate of the second pass-gate transistor PG2 is also connected to the word line 19. The drain of the pass-gate transistor PG2 is connected to bit line 16.

Figure 2:
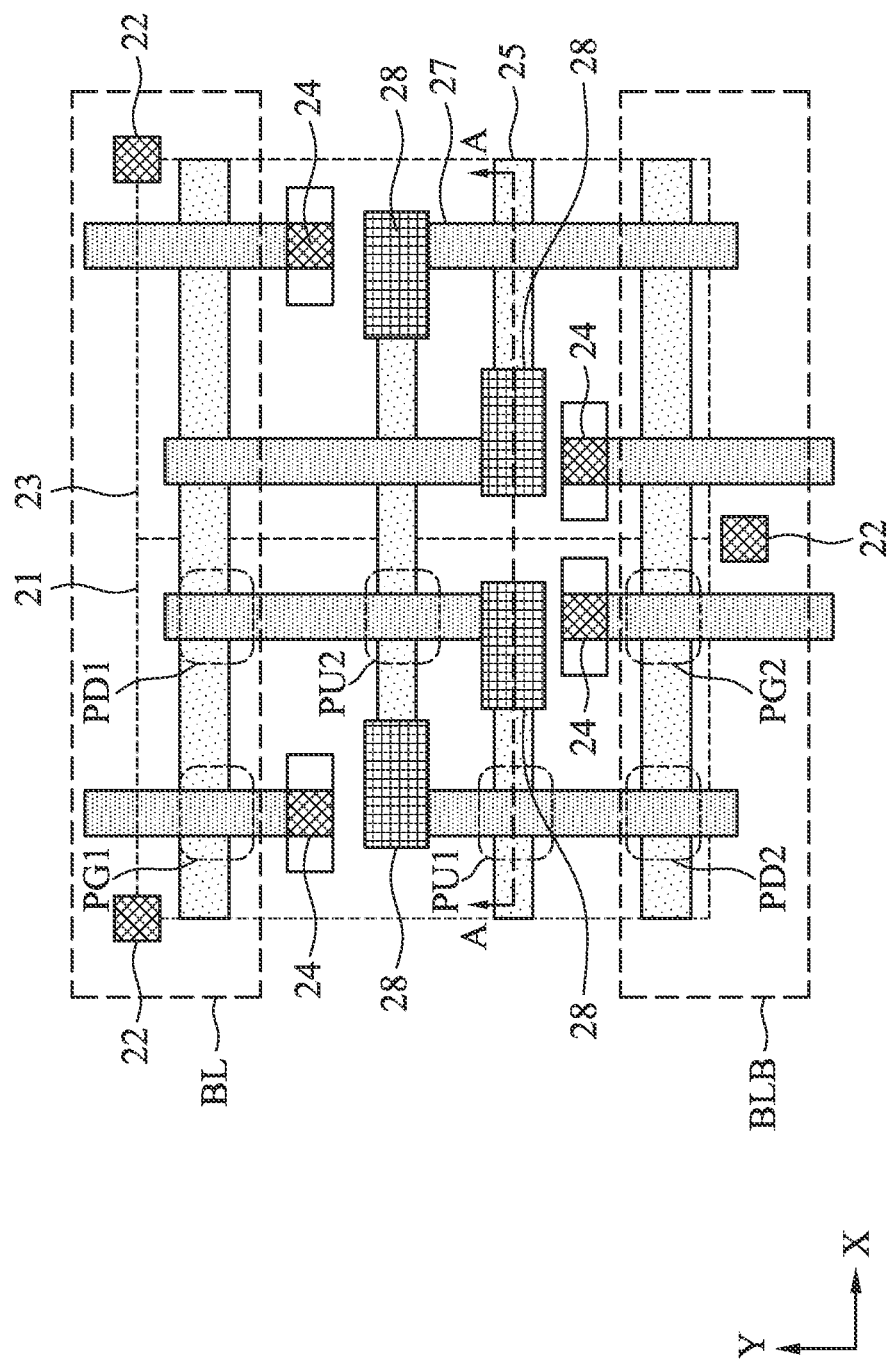
FIG. 2 illustrates an exemplary layout of the set of memory cells in FIG. 1, according to one or more aspects of the present disclosure.

FIG. 2 is a diagram showing an illustrative layout of the set of SRAM cells as in FIG. 1. The layout includes a plurality of active regions 25 in parallel with each other and a plurality of gate structures 27 in parallel with each other. The active regions are shown as elongated rectangles extending in the X-direction direction that is parallel to the bit lines BL/BLB. The widths of the active regions associated with NMOS devices may different from the widths of the active regions associated with PMOS devices. As illustrated in FIG. 2, the active regions at the top and bottom of the figure are wider (in the y-direction) than the center two active regions. The gate structures are shown as elongated rectangles extending in the Y-direction that is generally orthogonal to the X-direction. Transistors in the SRAM cells are formed at the intersections of the active regions 25 and the gate structures 27. In particular, two adjacent SRAM cells 21 and 23 are shown in FIG. 2. For one memory cell 21, the location of the transistors PG1, PD1, PU2, PU1, PD2, and PG2 are shown. It is noted that cell 23 is symmetric (reflected across Y-direction) to cell 21. Each cell (21 or 23) is symmetric within itself (reflected across X-direction and Y-direction).

In some implementations, the active region is a fin structure extending in the first direction. The active regions may include semiconductor materials (e.g., fin structures) formed on a substrate and doped to form source/drain regions on both sides of a gate. The shallow trench isolation (STI) features may be formed to isolate the active regions from each other. In some examples, the active regions may be fin active regions extruded above the STI features. In some examples, the active regions may be alternatively planar active regions or active regions with multiple channels vertically stacked (also referred to gate-all-around (GAA) structure). The active regions on either side of a gate structure include sources (or referred to as source features) and drains (or referred to as drain features). The source features and the drain features are interposed by respective gate stacks to form various field-effect transistors (FETs). The source features and drain features are collectively referred to as source/drain (S/D) features.

FIG. 2 also illustrates the locations of via connections 22, 24 that connect the transistors to the bit line BL or bit line bar BLB above. In particular, via connections 22 show where connections are made to either the bit line BL or bit line bar BLB. Via connections 24 show connections to word lines (not shown). In some examples, the word lines may be formed in a metallization layer above the bit lines BL/BLB. In some examples, the via connections 22, 24 may connect to the upper metal lines through an interconnect structure (not shown). The interconnect structure may include various contact features, via features and metal lines to connect FETs and other devices into functional circuits. The interconnect structure may include multiple metal layers each having a plurality of metal lines and via features to vertically interconnecting the metal lines in the adjacent metal layers, such as the bit lines BL/BLB or the word lines. In some examples, the contacts 28 may be butted contact features (BCT). The butted contact 28 may landing on an active region and a gate structure. For example, one butted contact 28 (the left one in FIG. 2) is connected to the common gate of the PU-1 and PD-2, and the source/drain features of the PU-2. Other butted contacts 28 similarly connect gate structures to an active region (source/drain feature) of an adjacent transistor.

Figure 3:
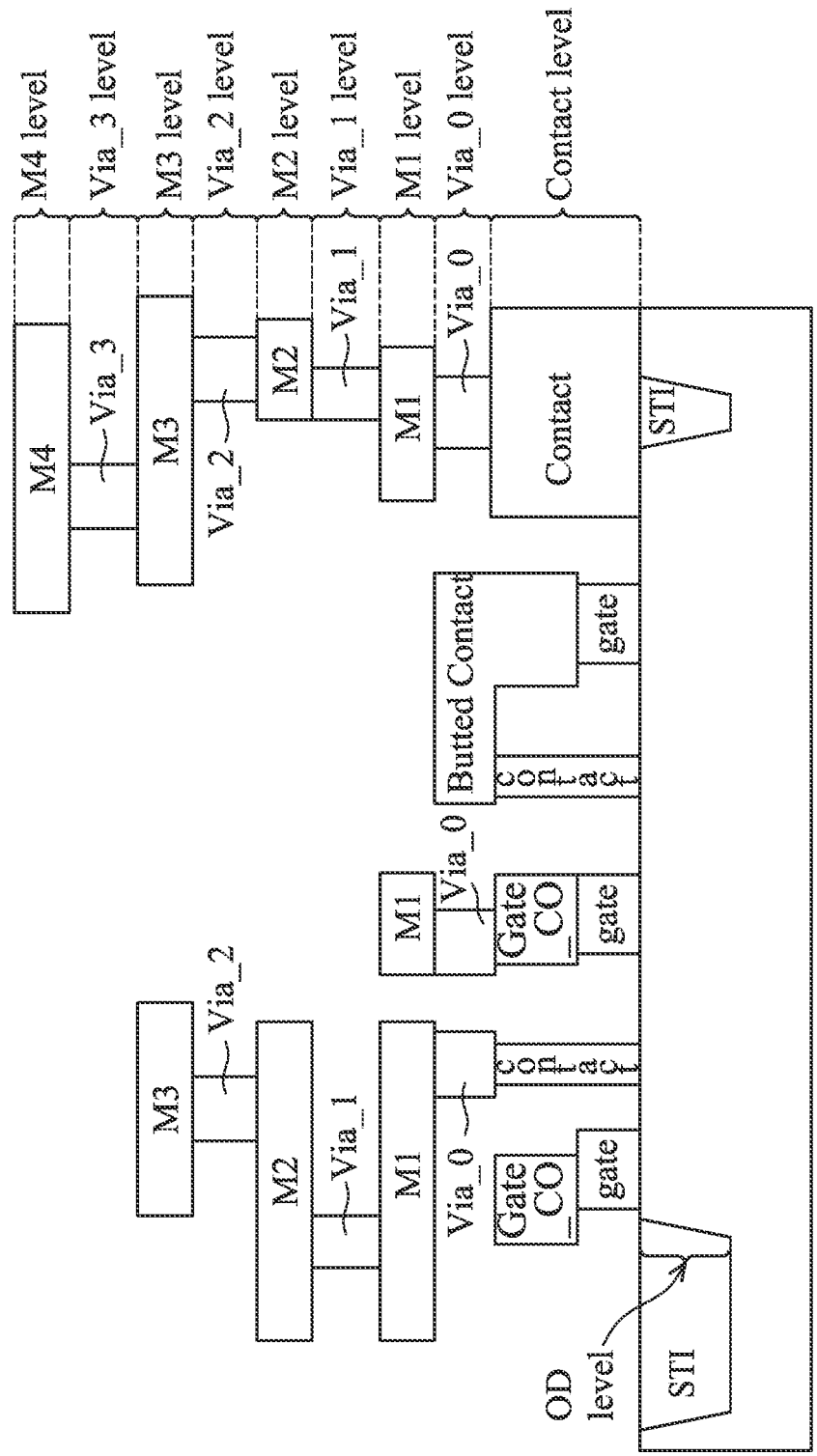
FIG. 3 illustrates a cross-sectional view of the layers involved in a set of memory cells, according to one or more aspects of the present disclosure.

FIG. 3 illustrates a schematic cross-sectional view of a plurality of layers involved in the set of SRAM cells, which layers are formed on a semiconductor chip or wafer and includes an illustrative butted contact. It is noted that FIG. 3 is schematically illustrated to show various levels of interconnect structure and transistors, and may not reflect the actual cross-sectional view of the set of SRAM cells. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level (and/or other higher Via_x levels and Mx levels). Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level. Butted contacts are referred to as such as they include a first contact portion extending to a gate and a second contact portion extending to a source/drain of the active region combined together in one structure. With ever-decreasing device sizes, a butted contact suffers from limited contact surfaces for interfacing a gate structure and a source/drain contact, which may lead to high contact resistance. Additionally, a butted contact is often not self-aligned and requires high overlay accuracy during lithography steps and may increase the cost of manufacturing.

The present disclosure provides a semiconductor structure that includes a butted contact to connect a source/drain contact on a source/drain feature of one transistor to a gate structure of another transistor. In some embodiments, the butted contact structure includes an extending portion that downwardly extends to a position laterally between the gate structure and a source/drain contact. The extending portion provides extra contacting surface on sidewalls of the gate structure and the source/drain contact, in addition to top surfaces of the gate structure and the source/drain contact. The extra contacting surface effectively reduces contact resistance and provides a low impedance path between the gate structure and the source/drain contact. The performance of the semiconductor structure implementing such a butted contact structure, such as but not limited to the set of SRAM cells as in FIG. 2, may accordingly be enhanced.

Figure 4:
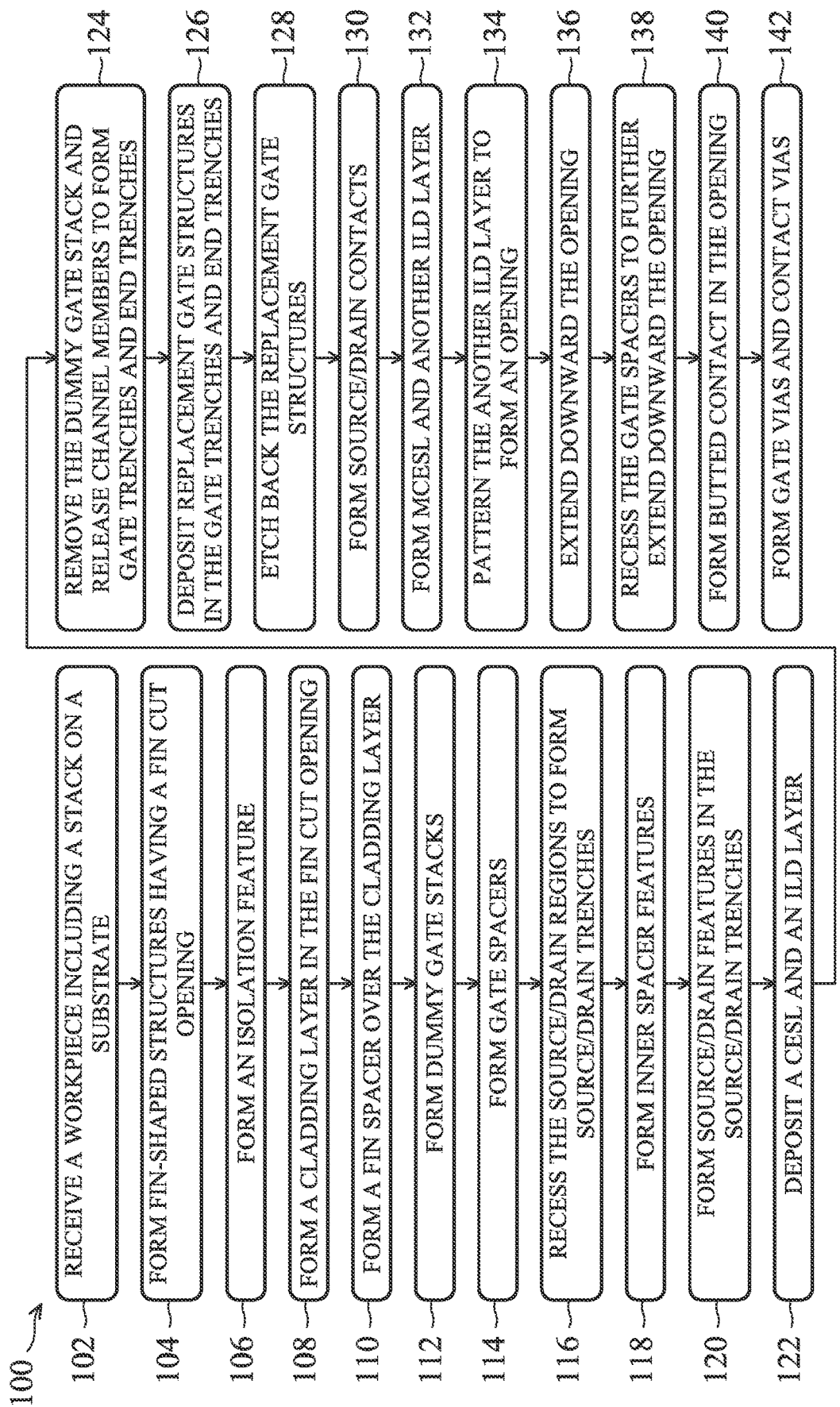
FIG. 4 illustrates a flowchart of a method for forming a semiconductor device, according to one or more aspects of the present disclosure.
Figure 5:
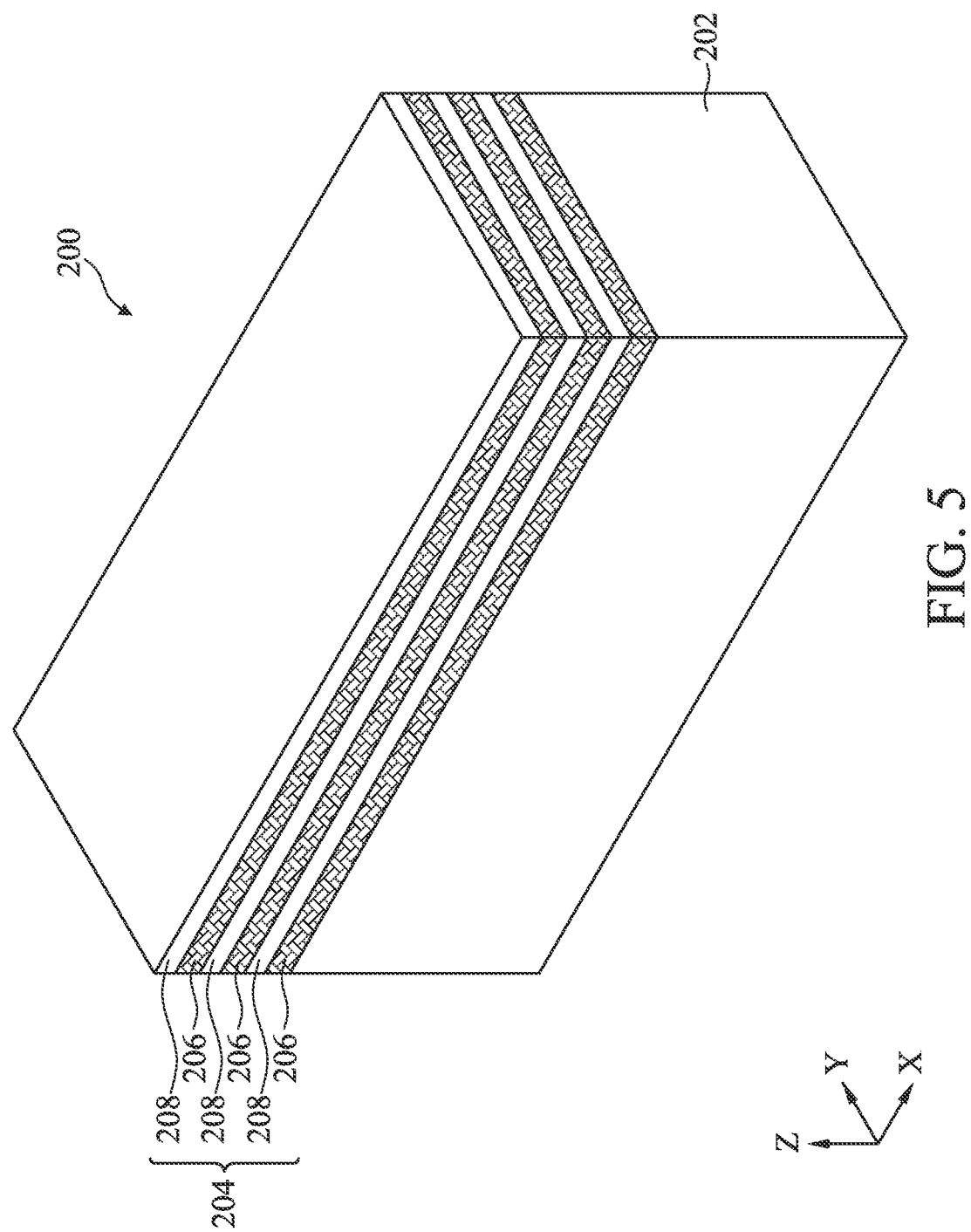
FIGS. 5 and 6 illustrate fragmentary perspective views of a workpiece during various fabrication stages in the method of FIG. 4, according to one or more aspects of the present disclosure.
Figure 6:
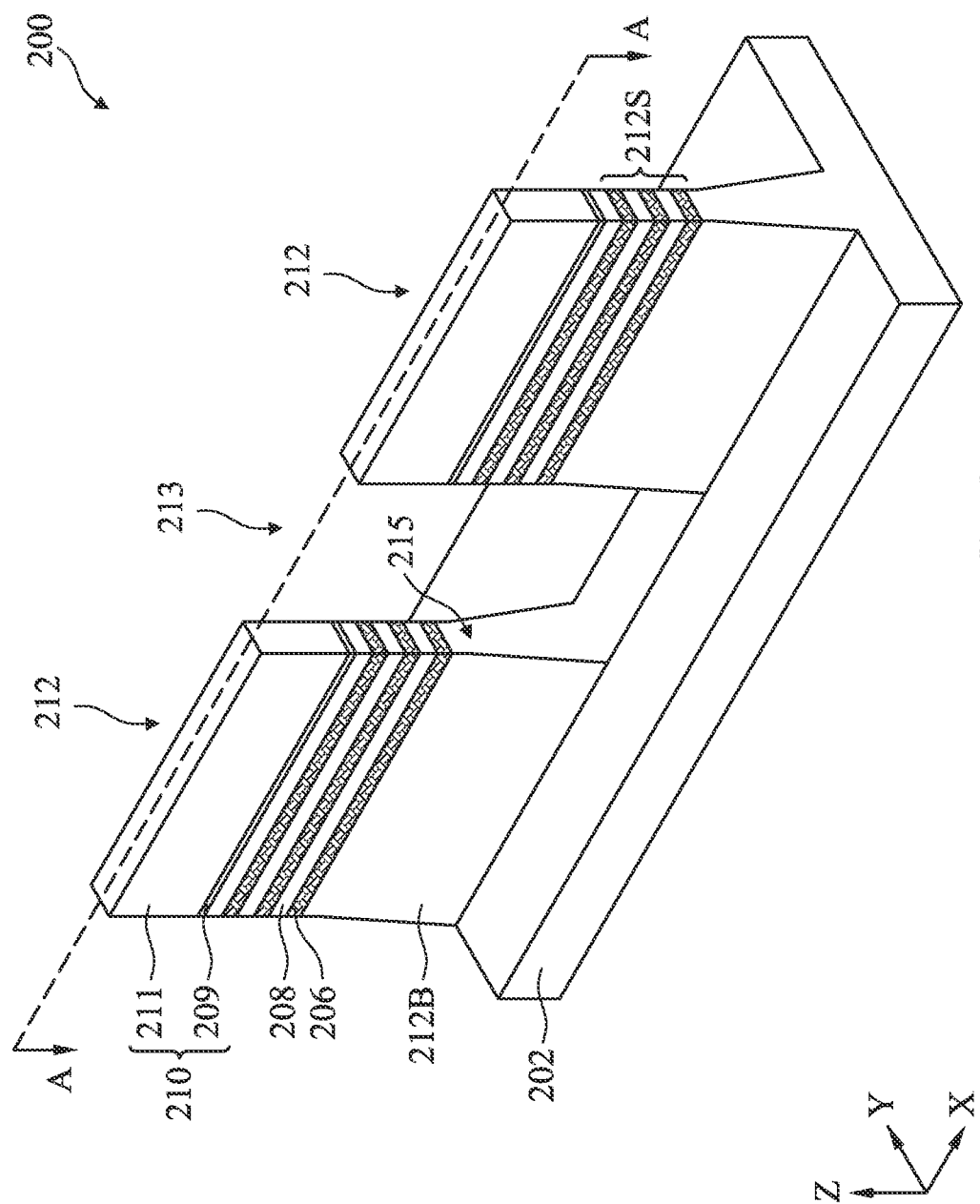

Forming a butted contact in accordance with various aspects of the present disclosure will now be described in more detail with reference to FIGS. 4-28. FIG. 4 illustrates a flowchart of a method 100 of forming a semiconductor device from a workpiece according to one or more aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the methods. Not all steps are described herein in detail for reasons of simplicity. Method 100 is described below in conjunction with FIGS. 5-28, which illustrate fragmentary perspective or cross-sectional views of a workpiece 200 at different stages of fabrication according to embodiments of method 100. FIGS. 5 and 6 illustrate fragmentary perspective view of the workpiece 200. FIGS. 7-28 illustrate fragmentary cross-sectional views along the A-A line in FIG. 6, as well as the A-A line in FIG. 2, which cuts through an active region of the workpiece 200 in the X-direction. Because a semiconductor device will be formed from the workpiece 200, the workpiece 200 may be referred to as a semiconductor device 200 as the context requires. Although embodiments that include MBC transistors are illustrated in the FIGS. 5-27, the present disclosure is not so limited and may be applicable to other multi-gate devices, such as a FinFET further illustrated in FIG. 28. As described above, MBC transistors may also be referred to as SGTs, GAA transistors, nanosheet transistors, or nanowire transistors.

Referring to FIGS. 4 and 5, method 100 includes a block 102 where a workpiece 200 is received. Referring to FIG. 5, the workpiece 200 includes a substrate 202 and an epitaxial stack 204 above the substrate 202. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (N-FET), p-type field effect transistors (P-FET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

The stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged, which are for illustrative purposes only and not intended to be limiting beyond what is specifically recited in the claims. The number of layers depends on the desired number of channel layers for the semiconductor device 200. In some embodiments, the number of the channel layers 208 is between 2 and 10.

Referring to FIGS. 4 and 6, method 100 includes a block 104 where fin-shaped structures 212 are patterned. For patterning purposes, a hard mask layer 210 may be formed over the stack 204. The hard mask layer 210 may be a single layer or a multilayer. In one example, the hard mask layer 210 is a multi-layer and includes a first layer 209 and a second layer 211 over the first layer 209. In some embodiments, the first layer 209 is formed of silicon nitride and the second layer 211 is formed of silicon oxide. In some alternative embodiments, the first layer is formed of silicon germanium (SiGe) and the second layer is formed of silicon (Si).

As shown in FIG. 6, each of the fin-shaped structures 212 includes a base portion 212B formed from a portion of the substrate 202 and a stack portion 212S formed from the stack 204. The stack portion 212S is disposed over the base portion 212B. In some embodiments, at block 104, the stack 204 and the substrate 202 are patterned to form the fin-shaped structures 212. The fin-shaped structures 212 extend lengthwise along the X-direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structures 212 by etching the stack 204 and the substrate 202. The etching process can include dry etching, wet etching, reactive ion etching (RIE), and/or other suitable processes. In some embodiments, the fin-shaped structures 212 may be segmented by a fin cut process to form a fin cut opening 213, as shown in FIG. 6. Each of the fin-shaped structures 212 has an end surface 215 exposed in the fin cut opening 213.

Figure 7:
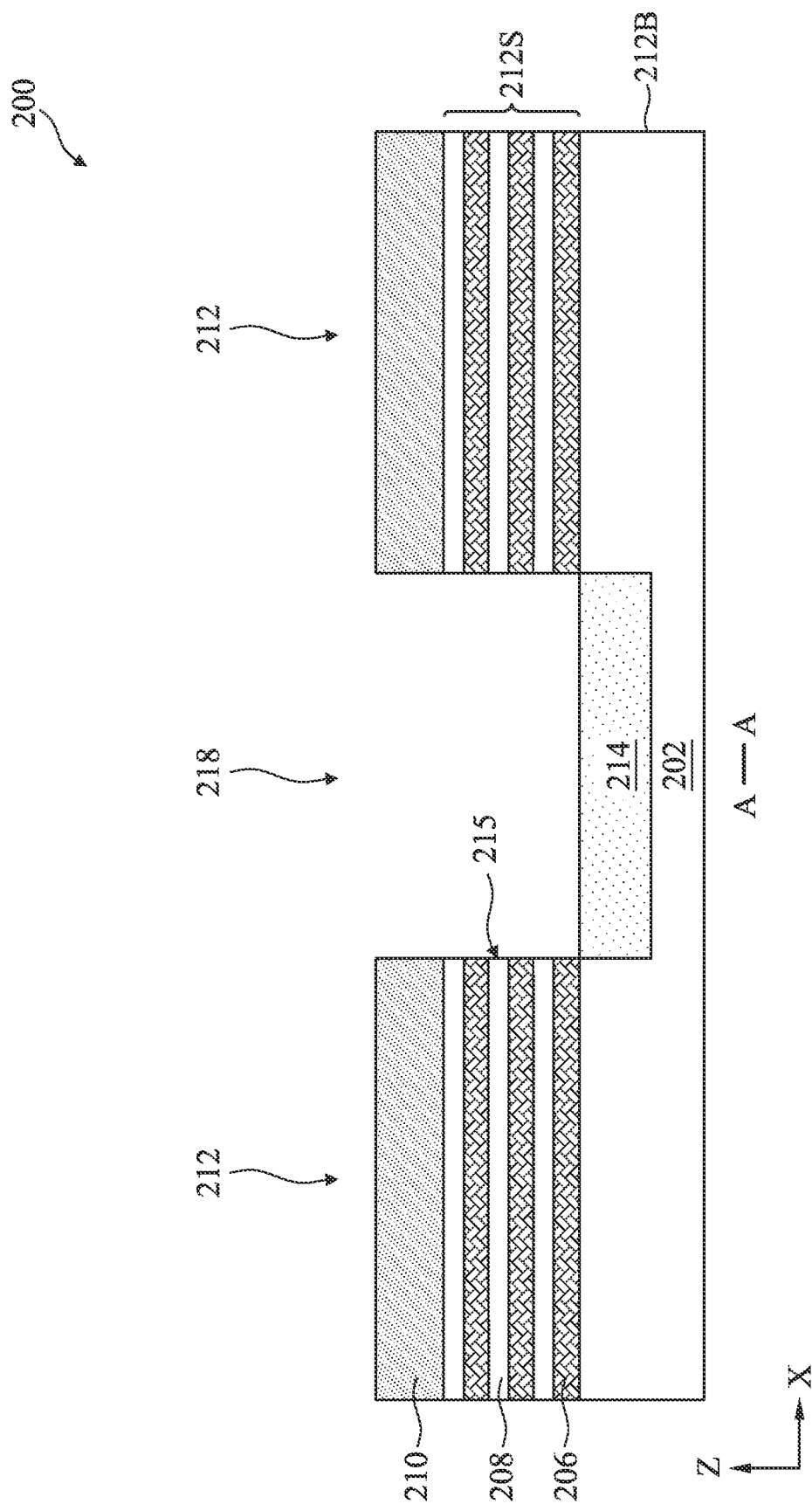
FIGS. 7-28 illustrate fragmentary cross-sectional views of a workpiece during various fabrication stages in the method of FIG. 4, according to one or more aspects of the present disclosure.

Referring to FIGS. 4 and 7, method 100 includes a block 106 where an isolation feature 214 is formed. After the fin-shaped structures 212 are formed, the isolation feature 214 is formed between neighboring fin-shaped structures 212. The isolation feature 214 may also be referred to as a shallow trench isolation (STI) feature 214. In an example process, a dielectric material for the isolation feature 214 is first deposited over the workpiece 200, filling the trenches between fin-shaped structures 212 with the dielectric material. The dielectric material for the isolation feature 214 is also deposited in the fin cut opening 213. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process, until at least a portion of the hard mask layer 210 is exposed. The planarized dielectric material is further recessed by a dry etching process, a wet etching process, and/or a combination thereof to form the isolation feature 214. As shown in FIG. 7, the stack portions 212S of the fin-shaped structures 212 rise above the isolation feature 214 while the base portions 212B are surrounded by the isolation feature 214.

Figure 8:
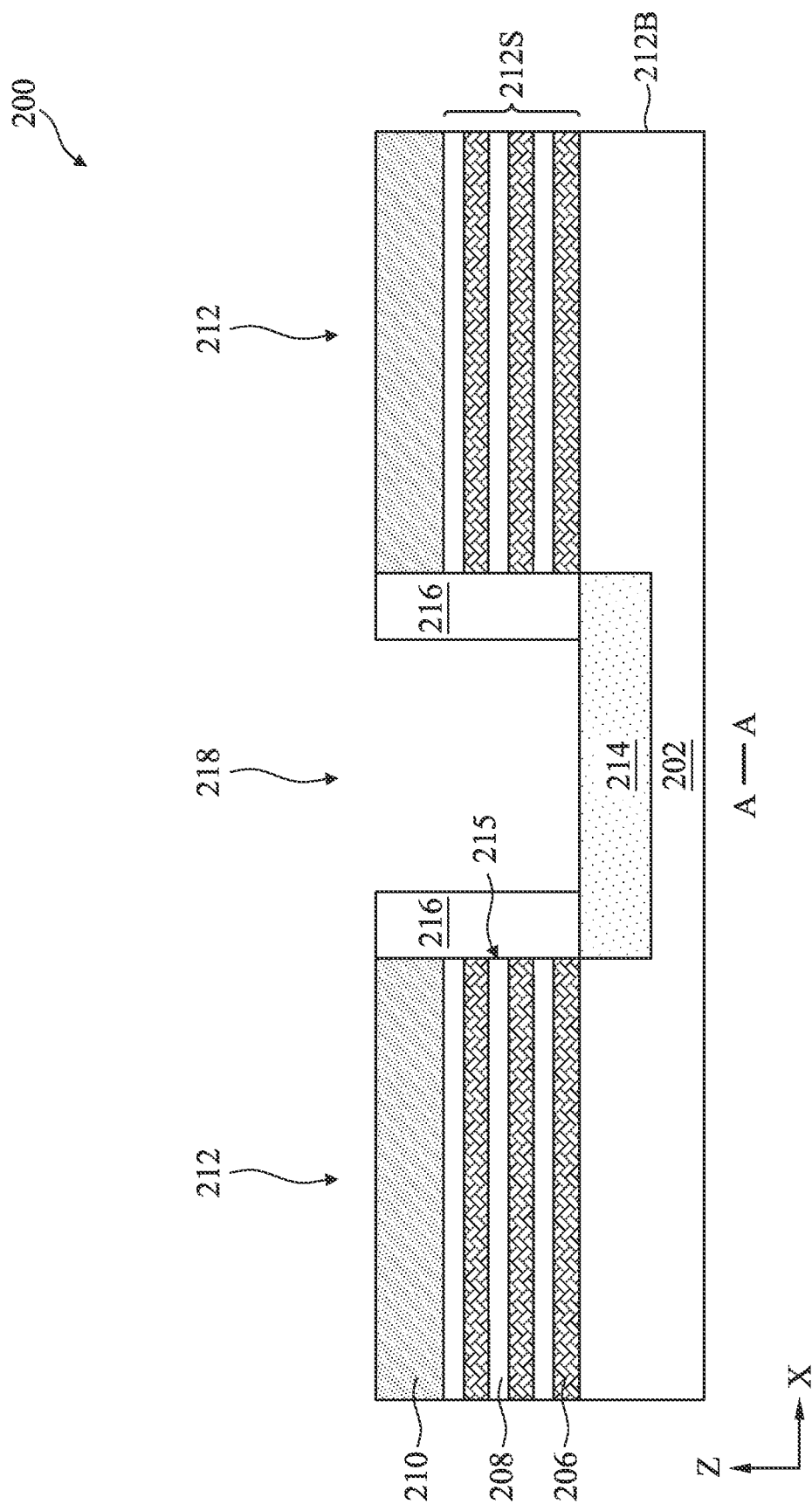

Referring to FIGS. 4 and 8, method 100 includes a block 108 where a cladding layer 216 is formed over the fin-shaped structures 212. In some embodiments, the cladding layer 216 may have a composition similar to that of the sacrificial layers 206. In one example, the cladding layer 216 may be formed of silicon germanium (SiGe), just like the sacrificial layers 206. This common composition allows selective removal of the sacrificial layers 206 and the cladding layer 216 in a subsequent process. In some embodiments, the cladding layer 216 may be conformally and epitaxially grown using vapor phase epitaxy (VPE) or molecular beam epitaxy (MBE). In some alternative embodiments, the cladding layer 216 may be deposited using chemical vapor deposition (CVD), atomic layer deposition (ALD), or other suitable deposition method. The cladding layer 216 is disposed on sidewalls of the fin-shaped structures 212, such as the end surface 215. In some embodiments where the deposition of the cladding layer 216 is not selective, operations at block 108 may include etch back processes to remove cladding layer 216 on the top surfaces of the fin-shaped structures 212 and the isolation feature 214. An example etch back process may be a dry etch process that includes use of plasma of hydrogen bromide (HBr), oxygen ($O_2$), chlorine ($Cl_2$), or mixtures thereof. In some instances, the cladding layer 216 may have a thickness between about 5 nm and about 10 nm.

Figure 9:
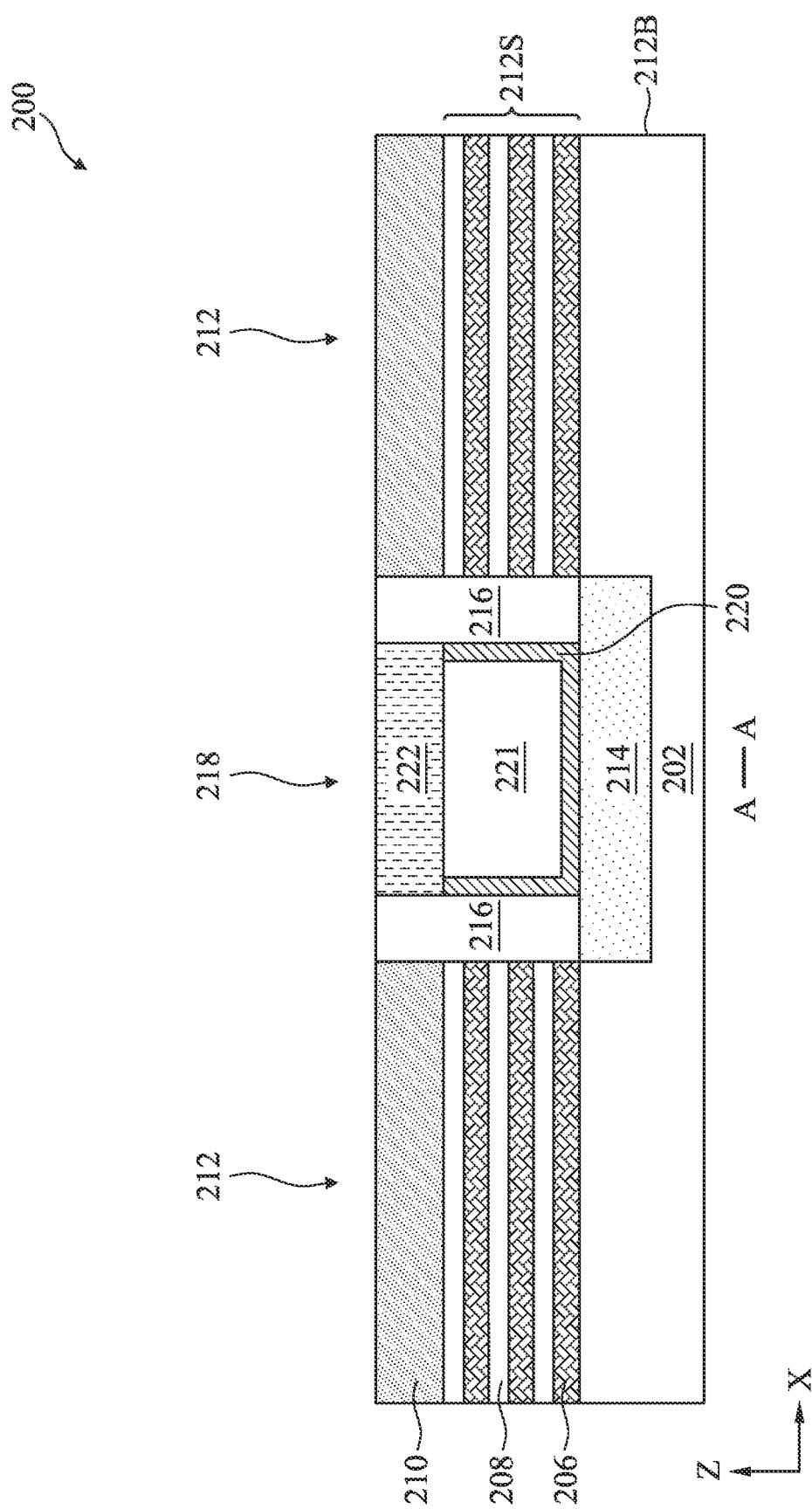

Referring to FIGS. 4 and 9, method 100 includes a block 110 wherein a fin spacer 218 is formed between fin-shaped structures 212 filling the fin cut opening 213. The fin spacer 218 may also be referred to as dielectric fin 218 for its fin shape. In an embodiment, a dielectric layer 220 is deposited conformally within the fin cut opening 213 including along sidewalls of the cladding layer 216 and along a top surface of the STI features 214. Thereafter, a dielectric layer 221 is deposited over the dielectric layer 220. In at least some embodiments, the dielectric layers 220 and 221 may collectively define the fin spacer 218. In some cases, a fin spacer 218 may further include a high-k dielectric layer formed over the dielectric layers 220 and 221, for example after recessing of the dielectric layers 220 and 221. Generally, and in some embodiments, the dielectric layers 220 and 221 may include SiN, SiCN, SiOC, SiOCN, SiOx, or other appropriate material. In some examples, the dielectric layer 220 may include a low-k dielectric layer, and the dielectric layer 221 may include a flowable oxide layer. In various cases, the dielectric layers 220 and 221 may be deposited by a CVD process, an ALD process, a PVD process, a spin-coating and baking process, and/or other suitable process. In some examples, after depositing the dielectric layers 220 and 221, a CMP process may be performed to remove excess material portions and to planarize a top surface of the workpiece 200.

The method 100 at the block 110 may further include a recessing process, a high-k dielectric layer deposition process, and a CMP process. In some embodiments, a recessing process is performed to remove top portions of the dielectric layers 220 and 221. In some embodiments, the recessing process may include a dry etching process, a wet etching process, and/or a combination thereof. In some embodiments, a recessed depth is controlled (e.g., by controlling an etching time) to result in a desired recessed depth. After the recessing process, a high-k dielectric layer 222 is deposited within trenches formed by the recessing process. In some embodiments, the high-k dielectric layer 222 may include $HfO_2$, $ZrO_2$, HfAlOx, HfSiOx, $Y_2O_3$, $Al_2O_3$, or another high-k material. The high-k dielectric layer 222 may be deposited by a CVD process, an ALD process, a PVD process, and/or other suitable process. After deposition of the high-k dielectric layer 222, a CMP process is performed to remove excess material portions and to planarize a top surface of the workpiece 200. Thus, in various cases, the fin spacer 218 is defined as having a lower portion including the recessed portions of the dielectric layers 220, 221 and an upper portion including the high-k dielectric layer 222.

Figure 10:
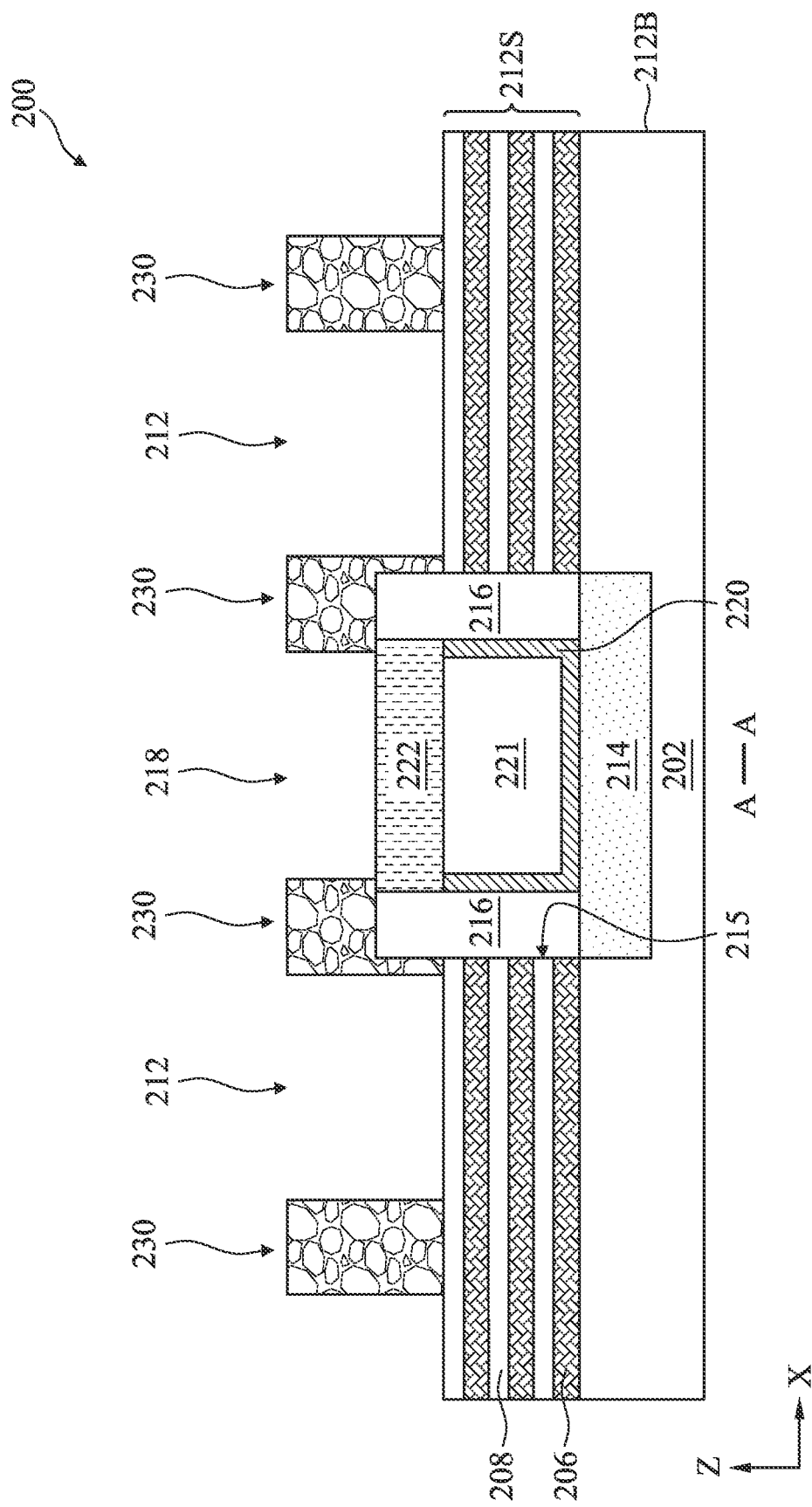

Referring to FIGS. 4 and 10, method 100 includes a block 112 where dummy gate stacks 230 are formed over the fin-shaped structures 212. In some embodiments, the hard mask layer 210 is removed prior to the forming of the dummy gate stacks 230, such as by a selective etching process. In some embodiments, a gate replacement process (or gate-last process) is adopted where the dummy gate stacks 230 serves as placeholders for functional gate structures. Other processes and configuration are possible. Each of the dummy gate stacks 230 may include a dummy electrode disposed over a dummy dielectric layer.

The regions of the fin-shaped structures 212 underlying the dummy gate stacks 230 may be referred to as channel regions. Each of the channel regions in a fin-shaped structure 212 is sandwiched between two source/drain regions for source/drain formation. In an example process, the dummy dielectric layer is blanketly deposited over the workpiece 200 by CVD. A material layer for the dummy gate electrodes is then blanketly deposited over the dummy dielectric layer. In order to pattern the material layer into dummy electrodes, a gate top hard mask (not shown) is deposited over the material layer. The gate top hard mask may be a multi-layer and include a silicon nitride mask layer and a silicon oxide mask layer over the silicon nitride mask layer. The material layer for the dummy electrodes is then patterned using photolithography processes to form the dummy electrodes. In some embodiments, the dummy dielectric layer may include silicon oxide and the dummy electrodes may include polycrystalline silicon (polysilicon). In some embodiments represented in FIG. 10, one of the dummy gate stacks 230 is formed at least partially over the cladding layer 216 deposited along the end surface 215 of the fin-shaped structure 212. The top surface of the cladding layer 216 is in direct contact with the dummy gate stack 230.

Figure 11:
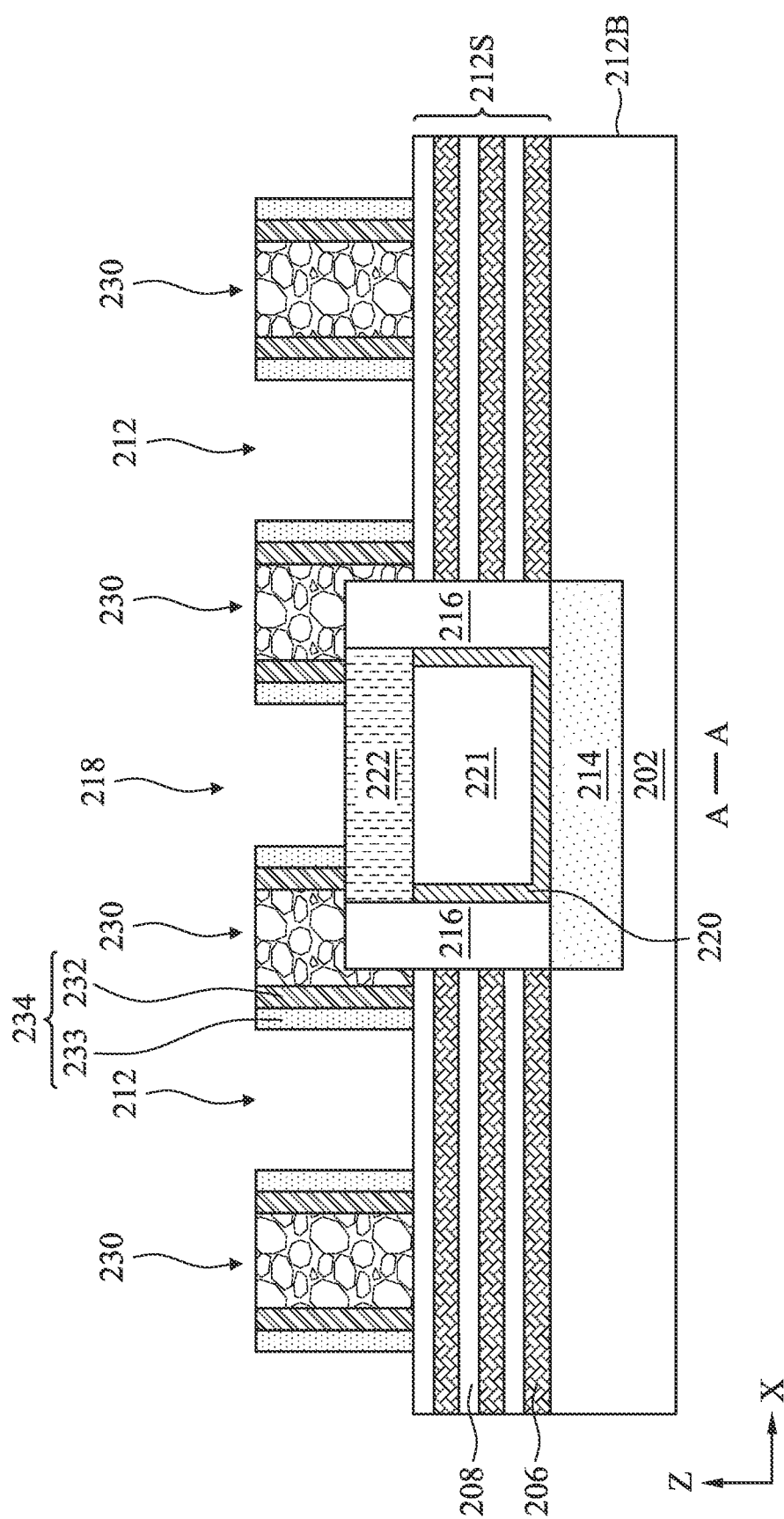

Referring to FIGS. 4 and 11, method 100 includes a block 114 where gate spacers 234 are formed along sidewalls of the dummy gate stacks 230. In some embodiments of the gate spacer formation step, a layer of gate spacer material is deposited on the workpiece 200. The layer of spacer material may be a conformal layer that is subsequently etched back to form the gate spacers 234. In some embodiments, the layer of spacer material includes multiple layers, for example, a first spacer layer 232 and a second spacer layer 233 formed over the first spacer layer 232. The first spacer layer 232 and the second spacer layer 233 are each made of a suitable material, such as silicon oxide, silicon nitride, silicon carbide, silicon oxynitride, SiCN, silicon oxycarbide, SiOCN, and/or combinations of the foregoing. By way of example and not limitation, the first and second spacer layers 232, 233 may be formed by sequentially depositing two different dielectric materials over the dummy gate stacks 230 using a process such as: a CVD process, a flowable CVD process, an ALD process, a PVD process, or other suitable process. An anisotropic etch process is then performed on the deposited spacer layers 232 and 233 to expose portions of the fin-shaped structures 212 not covered by the dummy gate stacks 230 (e.g., in the source/drain regions). The portions of the spacer layers 232 and 233 directly above the dummy gate stacks 230 may be completely removed by the anisotropic etch process. Portions of the spacer layers 232 and 233 on the sidewalls of the dummy gate stacks 230 may be retained, forming gate sidewall spacers, which are represented for simplicity as gate spacers 234. In some embodiments, the first spacer layer 232 is formed of silicon oxide having a lower dielectric constant than silicon nitride, and the second spacer layer 233 is formed of silicon nitride, wherein the silicon nitride has a higher etch resistance than the silicon oxide for subsequent etch processing (e.g., etching source/drain recesses). In some other embodiments, the first spacer layer 232 is formed of silicon nitride and the second spacer layer 233 is formed of silicon oxide. In some other embodiments, the first and second spacer layers 232, 233 may both be formed of silicon nitride but with different nitrogen concentrations. In some embodiments, the gate spacers 234 may be used to offset subsequently formed doped regions (e.g., source/drain regions). The gate spacers 234 may further be used to design or modify the source/drain region profile.

Figure 12:
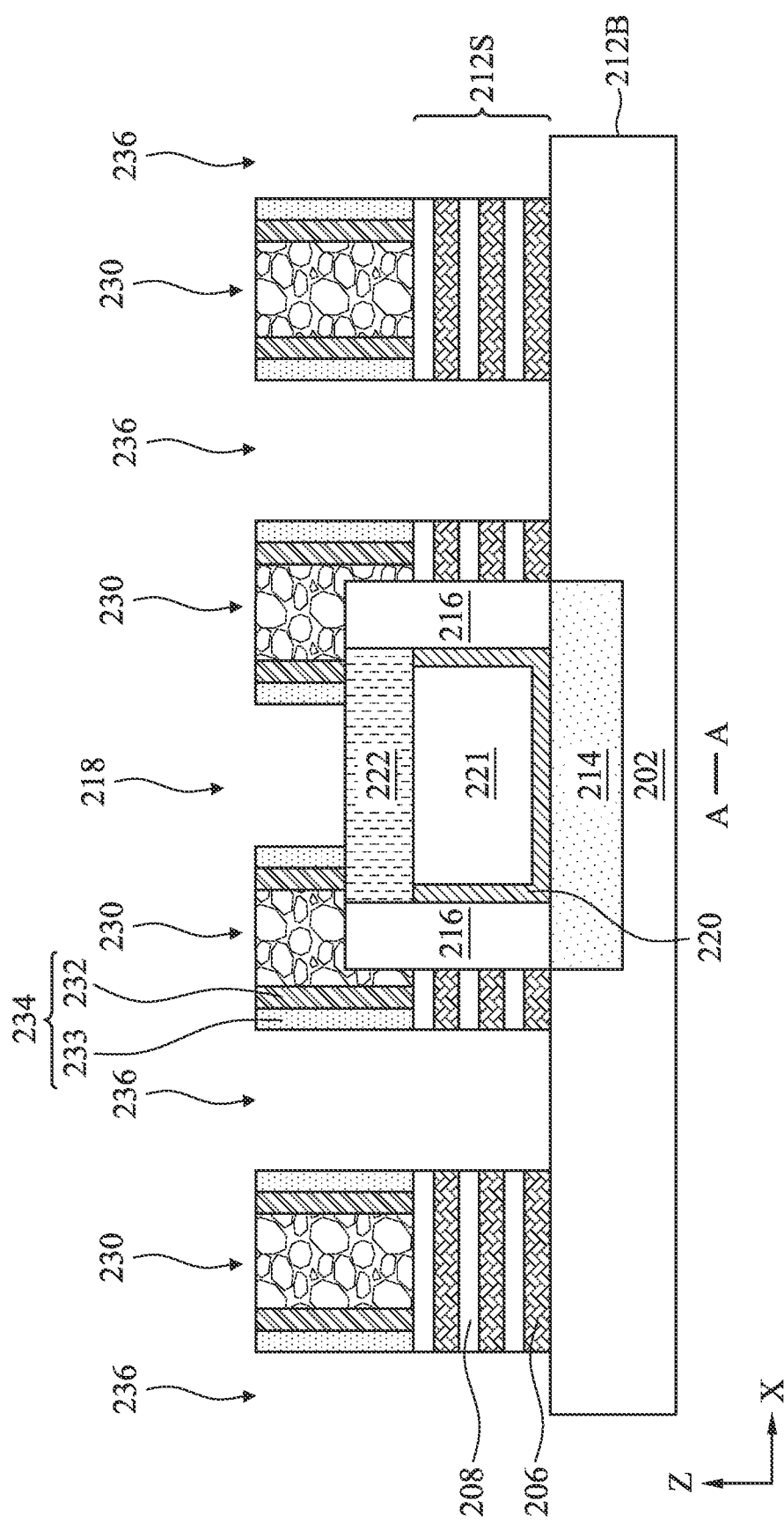

Referring to FIGS. 4 and 12, method 100 includes a block 116 where the source/drain regions are recessed to form source/drain trenches 236. With the dummy gate stacks 230 and the gate spacers 234 serving as an etch mask, the workpiece 200 is anisotropically etched to form the source/drain trenches 236 over the source/drain regions. In some embodiments, operations at block 116 may substantially remove the stack portions of fin-shaped structures 212 in the source/drain regions and the source/drain trenches 236 may extend into the base portions 212B, which is formed from the substrate 202. The anisotropic etch at block 116 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 13:
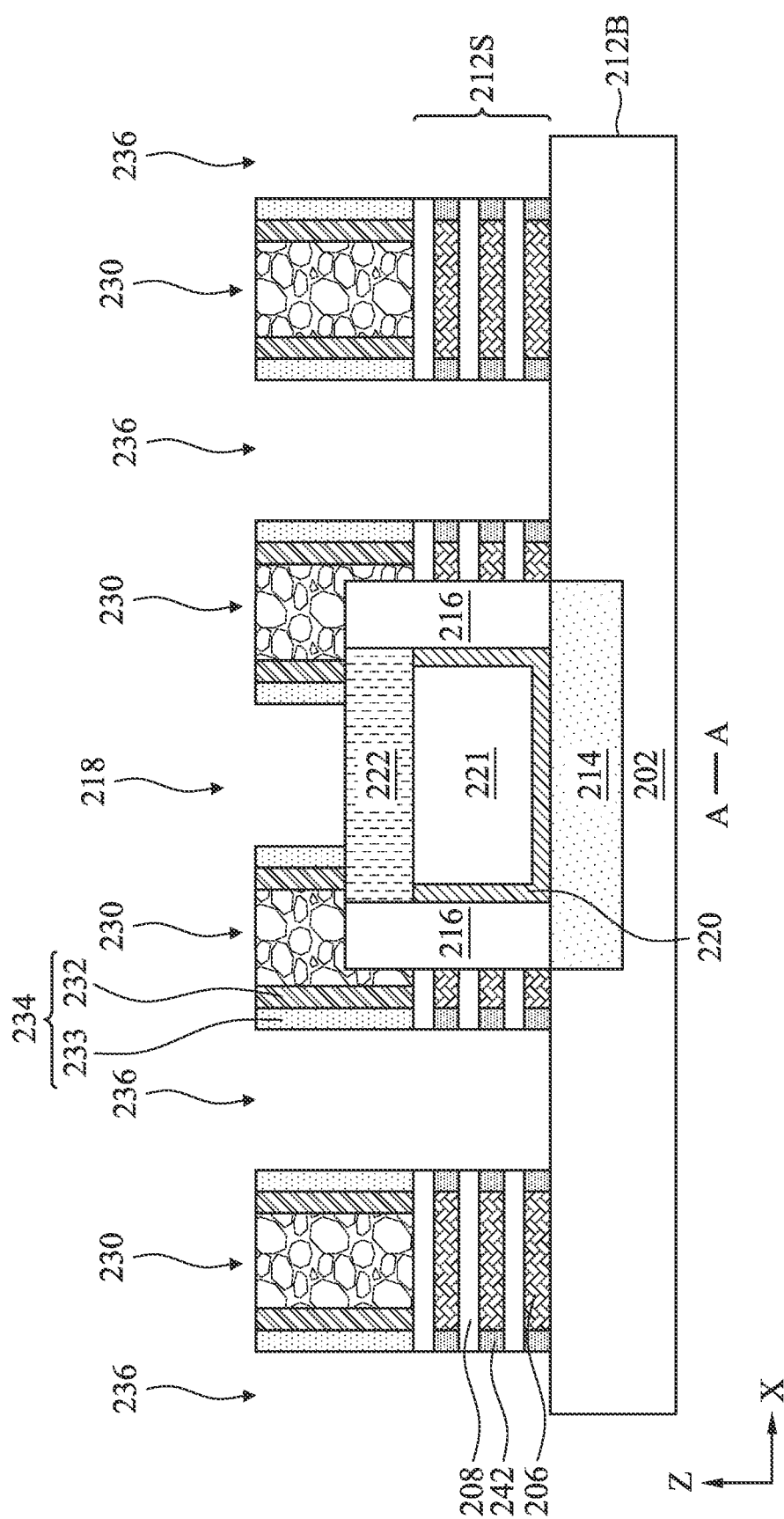

Referring to FIGS. 4 and 13, method 100 includes a block 118 where inner spacers 242 are formed. In some embodiments, the sacrificial layers 206 exposed in the source/drain trenches 236 are first selectively and partially recessed to form inner spacer recesses (not shown), while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include a SiGe oxidation process followed by a SiGe oxide removal. In some embodiments, the SiGe oxidation process may include use of ozone. In some other embodiments, the selective recess may be a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include a hydro fluoride (HF) or NH$_4$OH etchant. Even though the cladding layer 216 and the sacrificial layers 206 may share a similar composition, the cladding layer 216 is protected by the dummy gate stack 230 and the gate spacers 234 over it and is not etched. An inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silicon oxynitride. After the deposition of the inner spacer material layer, the inner spacer material layer is etched back to form inner spacers 242.

Figure 14:
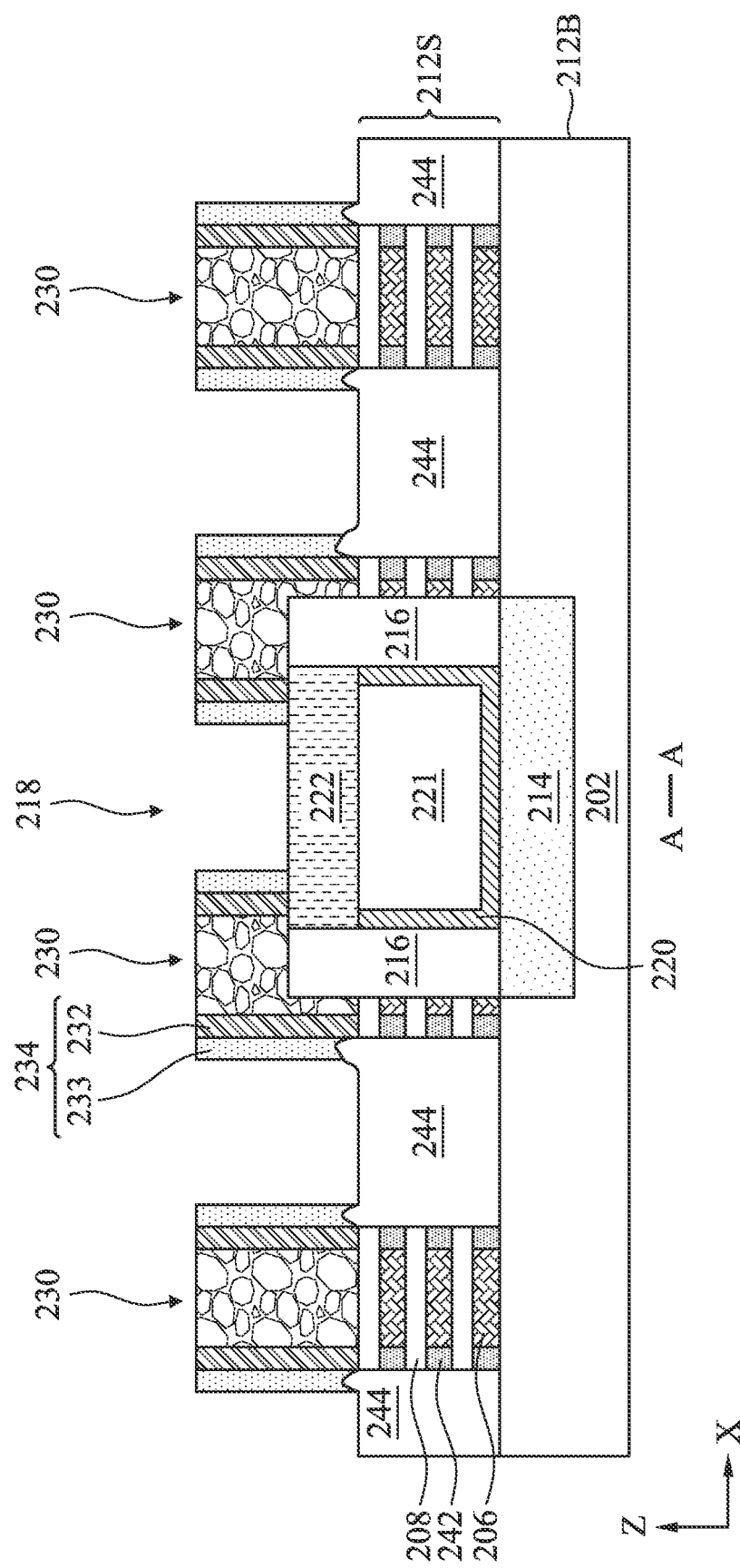

Referring to FIGS. 4 and 14, method 100 includes a block 120 where source/drain features 244 are formed in the source/drain trenches 236 by using one or more epitaxial processes that provide one or more epitaxial materials. The gate spacers 234 confine the epitaxial material or materials to the source/drain regions during the epitaxial growth process. In some embodiments, the lattice constant of source/drain features 244 is different from the lattice constant of channel layers 208, such that channel regions in the fin-shaped structure 212 and between source/drain features 244 may be strained or stressed to improve carrier mobility of the semiconductor device and enhance device performance. Epitaxial processes include CVD deposition techniques (e.g., PECVD, Vapor Phase Epitaxy (VPE), and/or ultra-high vacuum CVD (UHV-CVD)), molecular beam epitaxy, and/or other suitable processes. The epitaxial process may use gaseous and/or liquid precursors that interact with the composition of the channel layers 208. In some embodiments, source/drain features 244 may include Ge, Si, GaAs, AlGaAs, SiGe, GaAsP, SiP, or other suitable material. The source/drain features 244 may be in-situ doped during the epitaxial process by introducing dopants including: p-type dopants, e.g. boron or BF$_2$ a n-type dopants, such as phosphorus or arsenic; and/or other suitable dopants including combinations of the foregoing. If the source/drain features 244 is not in-situ doped, an implantation process (i.e., a junction implantation process) is performed to dope the source/drain features 244. In some example embodiments, the source/drain features 244 in the n-type transistor includes SiP, and the source/drain features 244 in the p-type transistor includes GeSnB and/or SiGeSnB. In embodiments with different device types, a mask (e.g., photoresist) may be formed over the n-type device regions while exposing the p-type device regions, and a p-type epitaxial structure may be formed in the p-type device regions. The mask may then be removed. Subsequently, a mask (e.g., photoresist) may be formed over the p-type device regions while exposing the n-type device regions, and an n-type epitaxial structure may be formed in the n-type device regions. The mask may then be removed. Once the source/drain features 244 are formed, an annealing process may be performed to activate p-type dopants or n-type dopants in the source/drain features 244. The annealing process may be, for example, rapid thermal annealing (RTA), laser annealing, millisecond thermal annealing (MSA) process, or the like. As discussed above, the gate spacers 234 may be used to design or modify the source/drain region profile. In the illustrated embodiment as shown in FIG. 14, the source/drain features 244 include tips that extend to positions under the gate spacers 234, particularly under the second spacer layer 233.

Figure 15:
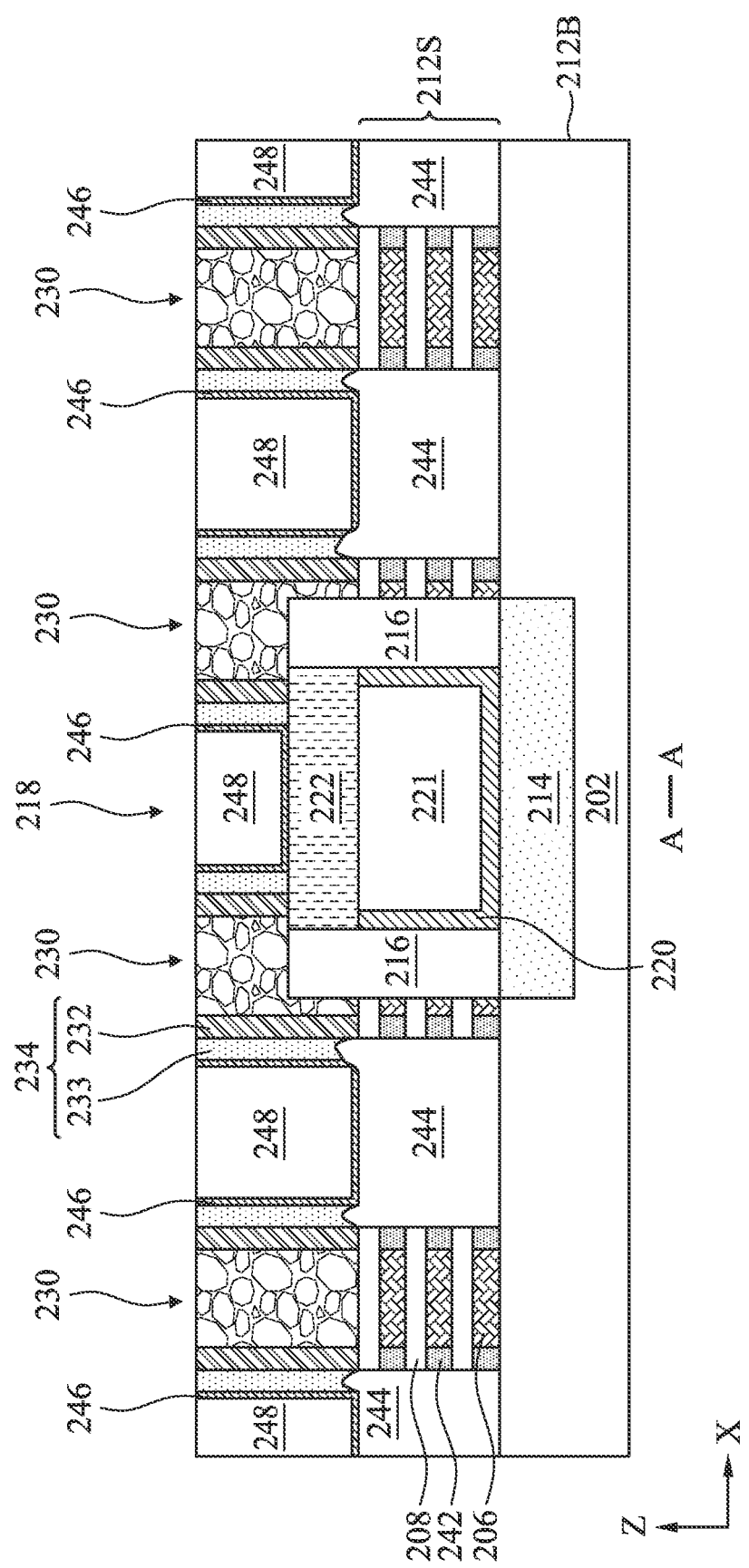

Referring to FIGS. 4 and 15, method 100 includes a block 122 where a contact etch stop layer (CESL) 246 and an interlayer dielectric (ILD) layer 248 are deposited. In an example process, the CESL 246 is first conformally deposited over the workpiece 200 and then the ILD layer 248 is blanketly deposited over the CESL 246. The CESL 246 may include silicon nitride, silicon oxide, silicon oxynitride, and/or other materials known in the art. The CESL 246 may be deposited using ALD, plasma-enhanced chemical vapor deposition (PECVD) process and/or other suitable deposition or oxidation processes. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by spin-on coating, an FCVD process, or other suitable deposition technique. In some embodiments, after formation of the ILD layer 248, the workpiece 200 may be annealed to improve integrity of the ILD layer 248. To remove excess materials and to expose top surfaces of the dummy gate stacks 230, a planarization process (such a chemical mechanical polishing (CMP) process) may be performed to the workpiece 200 to provide a planar top surface. Top surfaces of the dummy gate stacks 230 are exposed on the planar top surface.

Figure 16:
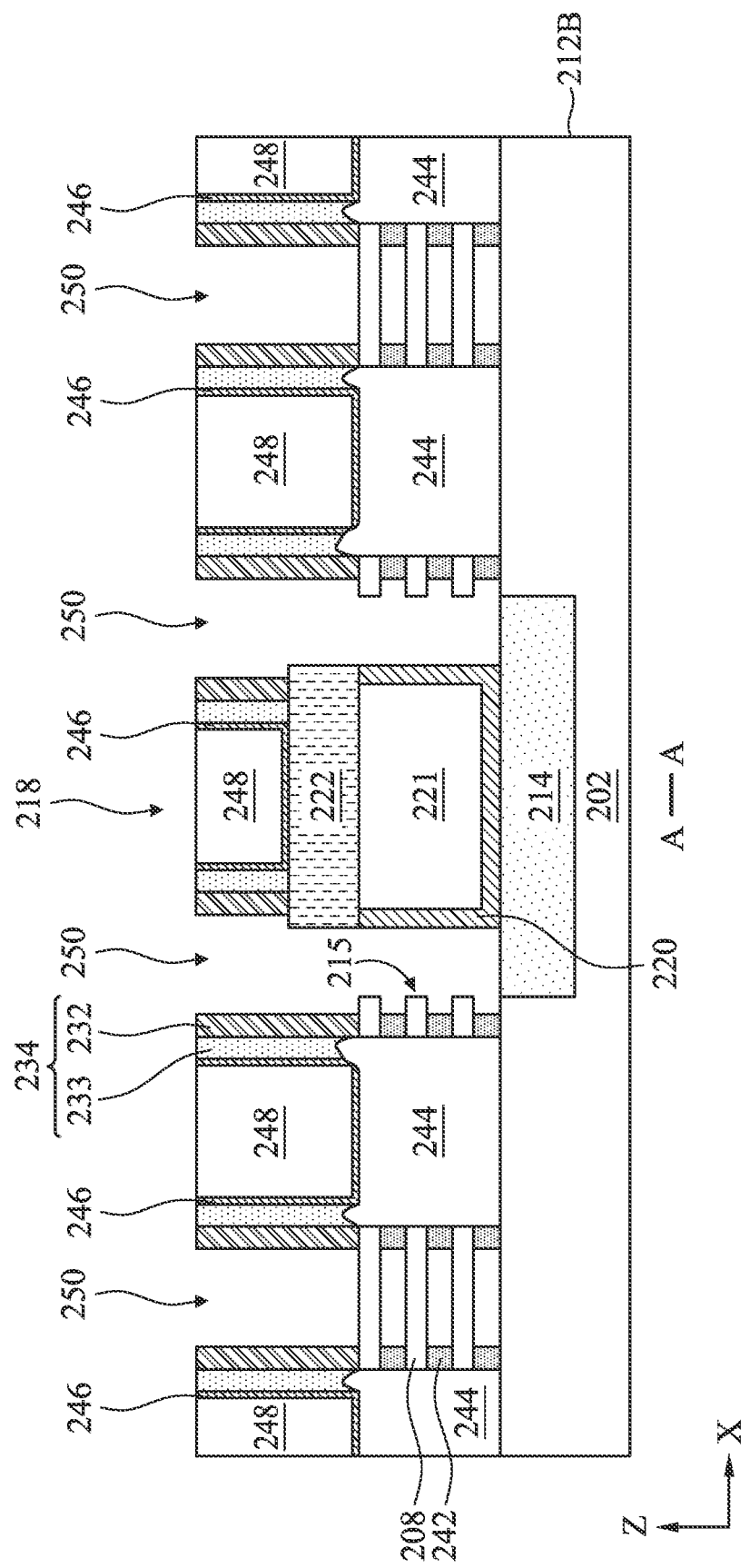

Referring to FIGS. 4 and 16, method 100 includes a block 124 where the dummy gate stacks 230 are removed and channel members 208 are released. The removal of the dummy gate stacks 230 results in gate trenches 250 over the channel regions. The removal of the dummy gate stacks 230 may include one or more etching processes that are selective to the material in the dummy gate stacks 230. For example, the removal of the dummy gate stacks 230 may be performed using as a selective wet etch, a selective dry etch, or a combination thereof. After the removal of the dummy gate stacks 230, sidewalls of channel layers 208 and sacrificial layers 206 in the channel regions are exposed in the gate trenches 250. The exposed sacrificial layers 206 between the channel layers 208 in the channel regions may be selectively removed to release the channel layers 208 to form channel members (denoted as channel members 208). The channel members 208 are vertically stacked along the Z-direction. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as NH$_4$OH. Because the cladding layer 216 shares a similar composition with the sacrificial layers 206, it is also selectively removed at block 124. The removal of the cladding layer 216 forms an end trench that exposes the end surface 215 of the fin-shaped structures 212. Sidewalls of the fin spacer 218, inner spacers 242, and the isolation feature 214 are exposed in the end trench.

Figure 17:
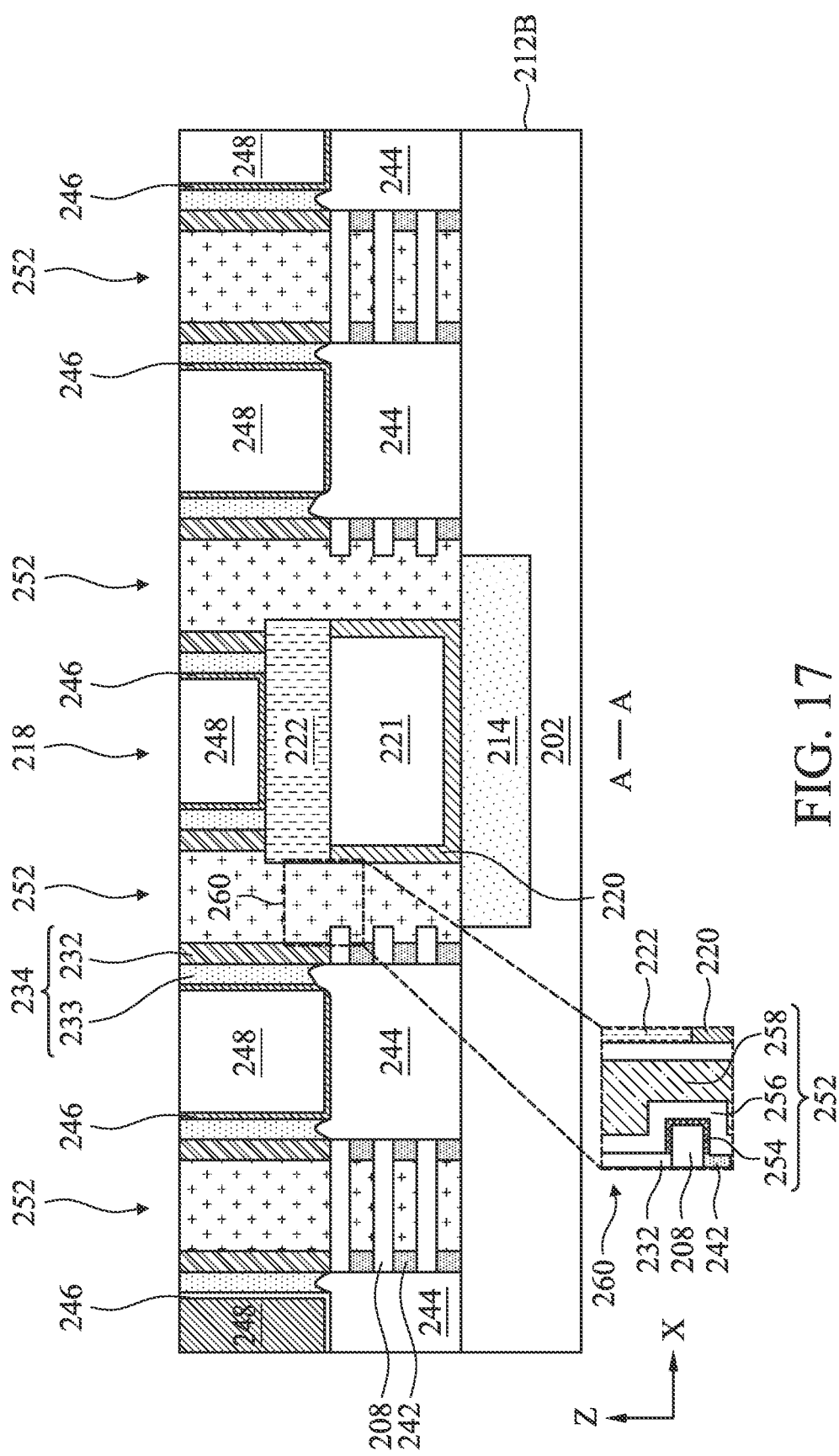

Referring to FIGS. 4 and 17, method 100 includes a block 126 where a replacement gate structure is formed in the gate trenches 250, including in the end trench. The replacement gate structure may be a high-k metal gate (HK MG) stack, however other compositions are possible. In various embodiments, the HK MG stack 252 includes an interfacial layer 254, a gate dielectric layer 256 formed over the interfacial layer 254, and a gate electrode layer 258 formed over the gate dielectric layer 256.

The interfacial layer 254 and the gate dielectric layer 256 are sequentially deposited to wrap around each of the channel members 208. In some embodiments, the interfacial layer 254 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 208 to form the interfacial layer 254. The gate dielectric layer 256 is then deposited over the interfacial layer 254 using ALD, CVD, and/or other suitable methods. As illustrated in a region 260 enlarged for clarity, the gate dielectric layer 256 is deposited conformally on sidewalls of the fin spacers 218 and the inner spacers 242. The gate dielectric layer 256 may be formed of high-K dielectric materials. As used herein, high-k dielectric materials include dielectric materials having a high dielectric constant, for example, greater than that of thermal silicon oxide (~3.9). The gate dielectric layer 256 may include hafnium oxide. Alternatively, the gate dielectric layer 256 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

The gate electrode layer 258 is subsequently deposited on the gate dielectric layer 256. The gate electrode layer 258 may be a multi-layer structure that includes at least one work function layer (not shown) and a metal fill layer (not shown). By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 258 may be formed by ALD, PVD, CVD, e-beam evaporation, or other suitable process. In various embodiments, a planarization process, such as a CMP process, may be performed to remove excessive materials to provide a substantially planar top surface of the replacement gate structures 252.

Figure 18:
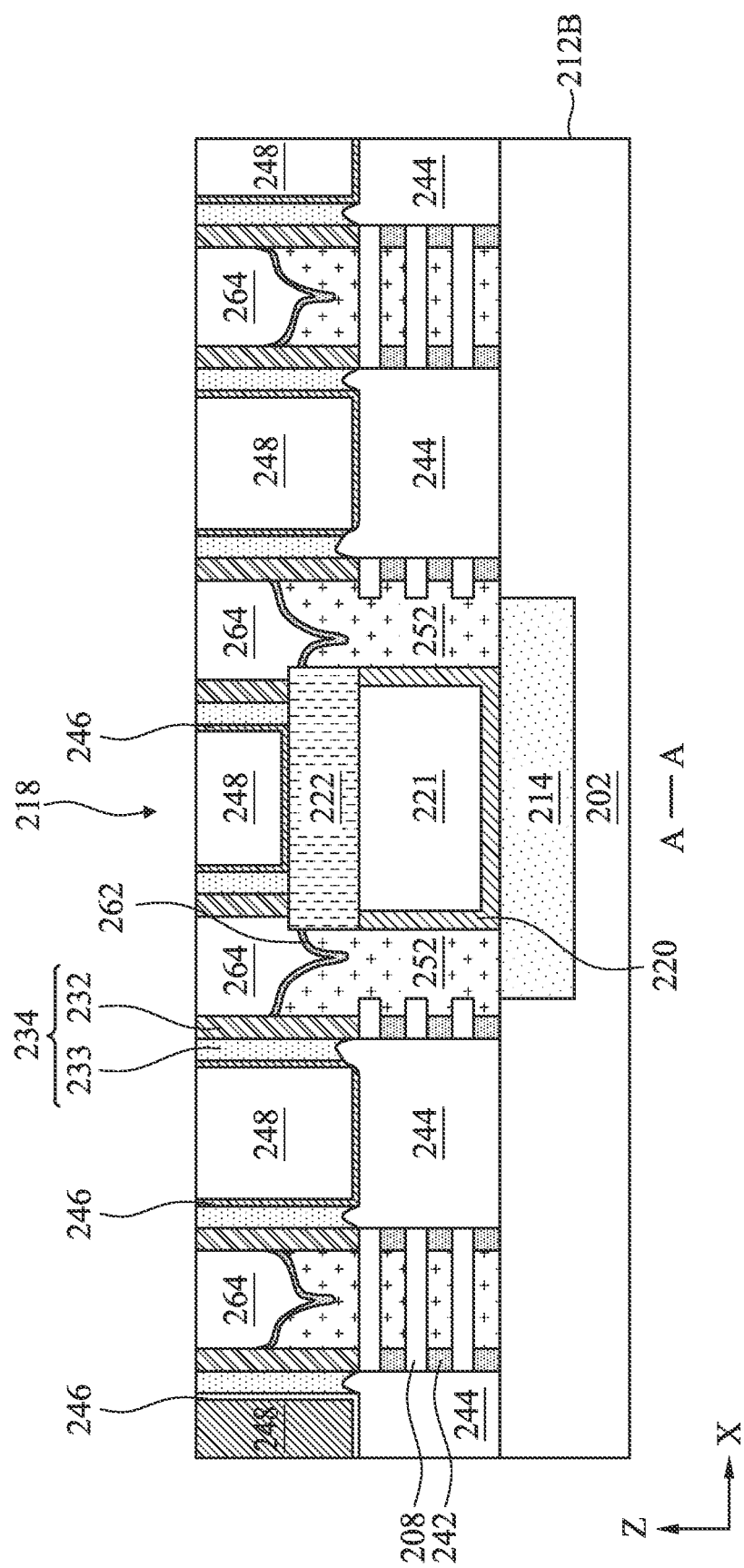

Referring to FIGS. 4 and 18, method 100 includes a block 128 where an etch-back process is performed to etch back the replacement gate structures 252, thereby forming a recess over the etched-back gate structures 252. In some embodiments, because the material of the replacement gate structures 252 have a different etch selectivity than the gate spacers 234, the selective etch process lowers the replacement gate structure 252 below the gate spacers 234. As a result, the top surface of the replacement gate structures 252 may be at a different height than the top surface of the gate spacers 234. Further, as illustrated in FIG. 18, a top surface of the etched-back gate structures 252 may be uneven, such as having dips. A bottom of the dips may be below a top surface of the fin spacer 218. The uneven profile (dipping) may be controlled in the etch-back process. The uneven profile increases contact surface between the top surface of the gate structures 252 and the to-be-formed butted contact, thus reducing contact resistance. A gate metal capping layer 262 is then formed by an appropriate process, such as CVD or ALD, atop the etched-back gate structures 252. In some embodiments, the gate metal capping layer 262 is formed on the etched-back gate structures 252 using a bottom-up approach. For example, the gate metal capping layer 262 is selectively grown on the metal surfaces (e.g., work function layer and metal fill layer), so the sidewalls of gate spacers 234 are substantially free of growing metal capping layer 262. By way of example and not limitation, the gate metal capping layer 262 may be a substantially fluorine-free tungsten (FFW) film having an amount of fluorine impurities less than 5 atomic percent and an amount of chlorine impurities greater than 3 atomic percent.

Subsequently, a gate dielectric capping layer 264 is deposited over the gate metal capping layer 262 until the recess formed by recessing the replacement gate structure 252 is overfilled. The gate dielectric capping layer 264 comprises SiN, SiC, SiCN, SiON, SiCON. The gate dielectric capping layer 264 is formed by a suitable deposition technique such as: CVD, plasma enhanced CVD, ALD, plasma enhanced ALD, combinations thereof, or the like. After deposition of the gate dielectric capping layer 264, a CMP process is performed to remove excess material portions and to planarize a top surface of the workpiece 200.

Figure 19:
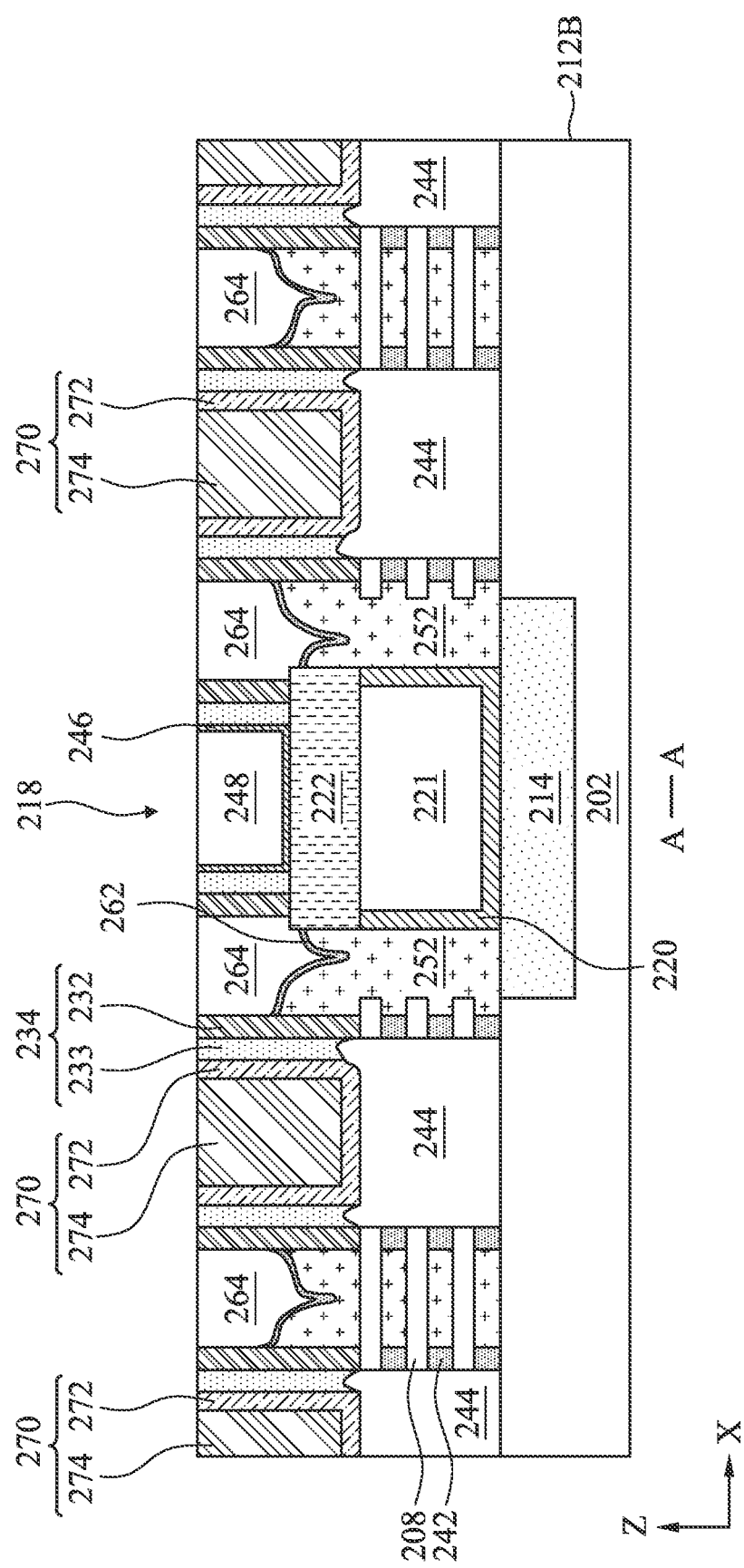

Referring to FIGS. 4 and 19, method 100 includes a block 130 where source/drain contacts 270 are formed that extend through the ILD layer 248 and the CESL 246. The formation of the source/drain contacts 270 includes, for example but is not limited to: performing one or more etching processes to form contact openings extending through the ILD layer 248 and the CESL 246 to expose source/drain features 244; depositing one or more metallic materials that overfill the contact openings; a CMP process is then performed to remove excess metal material located outside the contact openings. In some embodiments, the one or more etching processes is a selective etch that etches the ILD layer 248 and the CESL 246 at a faster etch rate than the gate dielectric capping layer 264 and the gate spacers 234. As a result, selective etching is performed using the gate dielectric capping layer 264 and the gate spacers 234 as an etch mask so that the contact openings (and thus the source/drain contacts 270) are formed to be self-aligned with the source/drain features 244 without using an additional photolithography process. Further, the ILD layer 248 and the CESL 246 above the fin spacer 218 may also be removed in a self-aligned manner and the source/drain contact 270 may also be deposited above the fin spacer 218. In this case, the gate dielectric capping layer 264 that allow the source/drain contacts 270 to be formed in a self-aligned manner may be referred to as self-aligned contact (SAC) caps 264. In the illustrated embodiment in FIG. 19, the ILD layer 248 and the CESL 246 above the fin spacer 218 remain, such as by forming a mask above the fin spacer 218 to protect this portion of the ILD layer 248 and the CESL 246 from the etching process. In some embodiments, the source/drain contact 270 includes a contact layer 272 that is blanket lined over sidewalls and bottom of the contact openings and over the source/drain features 244 and a metal fill layer 274 deposited over the contact layer 272, such as shown in FIG. 19. The contact layer 272 may include titanium (Ti), aluminum (Al), titanium nitride (TiN), tungsten (W), or another suitable contact metal. The metal fill layer 274 may be formed of tungsten (W) or cobalt (Co).

Figure 20:
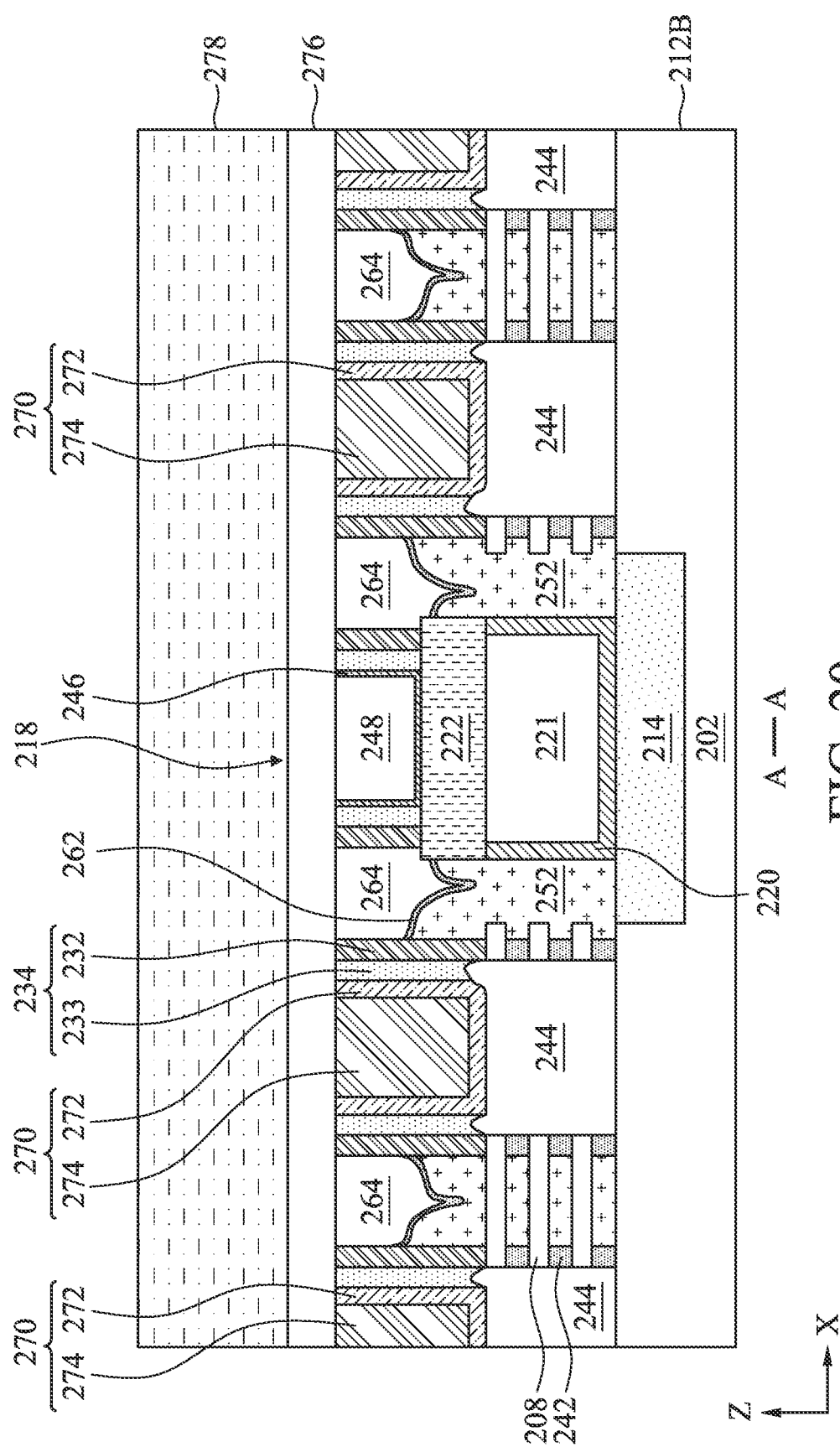

Referring to FIGS. 4 and 20, method 100 includes a block 132 where an intermediate contact etch stop layer (MCESL) 276 is formed over the source/drain contacts 270 and the SAC caps 264. The MCESL 276 may be formed by a PECVD process and/or other suitable deposition processes. Subsequently, another ILD layer 278 is formed over the MCESL 276. In some embodiments, the MCESL 276 is a silicon nitride layer and/or other suitable material having a different etch selectivity than the subsequently formed ILD layer 278. In some embodiments, the ILD layer 278 comprises materials such as tetraethoxysilane (TEOS) oxide, undoped silicate glass, or doped silicon oxide (e.g., borophosphosilicate glass (BPSG), Fused Silica Glass (FSG), phosphosilicate glass (PSG), boron doped silicon glass (BSG), etc.), and/or other suitable dielectric materials. In some embodiments, the ILD layer 278 is formed of silicon oxide. The ILD layer 278 may be deposited by a PECVD process or other suitable deposition technique.

Figure 21:
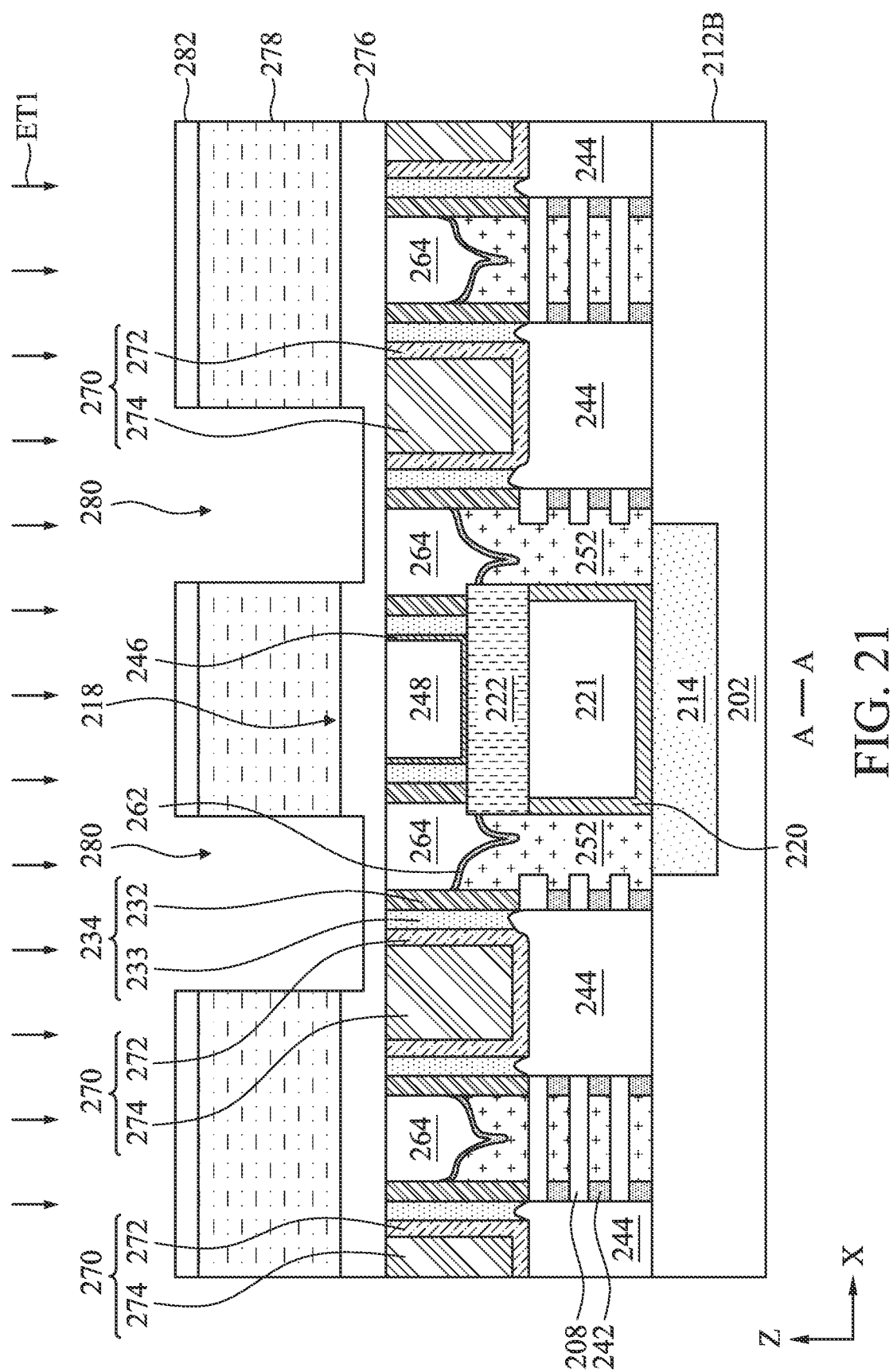

Referring to FIGS. 4 and 21, method 100 includes a block 134 where the ILD layer 278 is patterned by using a first etch process (denoted as ET1) to form contact openings 280 over the replacement gate structures 252 in the end trenches that is positioned in the fin cut opening 213 (FIG. 6). The etch duration of the first etch process ET1 is controlled to allow portions of the MCESL 276 to be removed, but not to punch through the MCESL 276. As a result of this first etching process ET1, contact openings 280 extend in the MCESL 276 but not throughout the entire thickness of the MCESL 276. In some embodiments, prior to the first etch process ET1, a lithography process is performed to define a patterned mask 282 with openings overlying where contact openings 280 locate. For example, the lithography process may include: spin coating a photoresist layer over the ILD layer 278; performing a post-exposure baking process; and developing the photoresist layer to form the patterned mask 282. In some embodiments, patterning the photoresist to form the patterned mask 282 may be performed using an electron beam (e-beam) lithography process or an Extreme Ultraviolet (EUV) lithography process. In some embodiments, the first etch process ET1 is an anisotropic etch process, such as a plasma etch.

Figure 22:
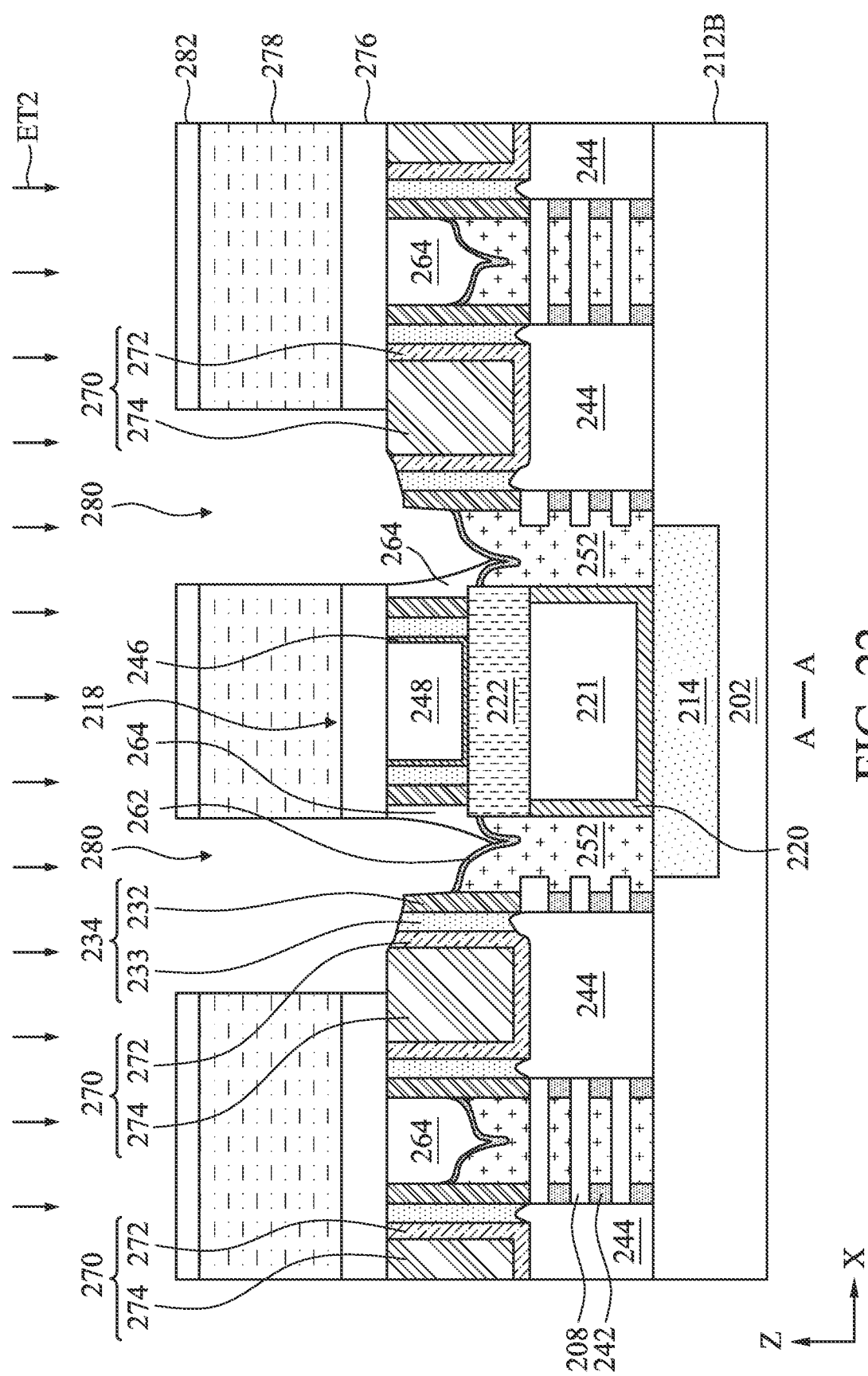

Referring to FIGS. 4 and 22, method 100 includes a block 136 where the contact openings 280 are extended downward through the MCESL 276 and the SAC caps 264 by using a second etch process (denoted as ET2). The duration of the second etch process ET2 is controlled to penetrate (or be referred to as punch-through) the MCESL 276 and the SAC caps 264, deepening or extending the contact openings 280 down to the source/drain contact 270 and the gate metal capping layer 262. As a result of the second etch process ET2, top surfaces of the source/drain contacts 270 and the gate metal capping layer 262 are exposed at the bottom of the deepened contact openings 280. In some embodiments, the second etch process ET2 is an anisotropic etch process, e.g., a plasma etch (e.g., Inductively Coupled Plasma (ICP), Capacitively Coupled Plasma (CCP), etc.) using a different etchant and/or etch conditions than the first etch process ET1. The gate metal capping layer 262 can act as a detectable etch endpoint, which in turn prevents over-etching and thus punch through or penetration of the gate metal capping layer 262. In some embodiments, because the material of the contact layer 272 and the gate spacers 234 (first and second spacer layers 232, 233) have less etch selectivity than the MCESL 276 and the SAC caps 264, the contact layer 272 and the gate spacers 234 is slightly recessed but substantially remain. In some embodiments, through the ILD layer 278 and the MCESL 276, the contact openings 280 have a tapered sidewall profile due to the nature of the anisotropic etch. However, in some other embodiments, the etching conditions may be fine-tuned to allow the contact openings 280 to have a vertical sidewall profile through the ILD layer 278 and the MCESL 276, as shown in FIG. 22. The remaining portion of the SAC caps 264 exposed in the contact openings 280 (above the gate metal capping layer 262) may have a tapered sidewall profile.

If the butted contact is formed in the contact openings 280 as after the second etch process ET2, the butted contact relies on its interfacing with the top surfaces of the source/drain contacts 270 and the gate metal capping layer 262 for electric contacts. As the device size decreases, the available top surfaces become limited and the contact resistance in turn increases. Further, overlay inaccuracy may cause contact openings 280 to misalign with either the source/drain contacts 270 or the gate metal capping layer 262, causing disconnection.

Figure 23:
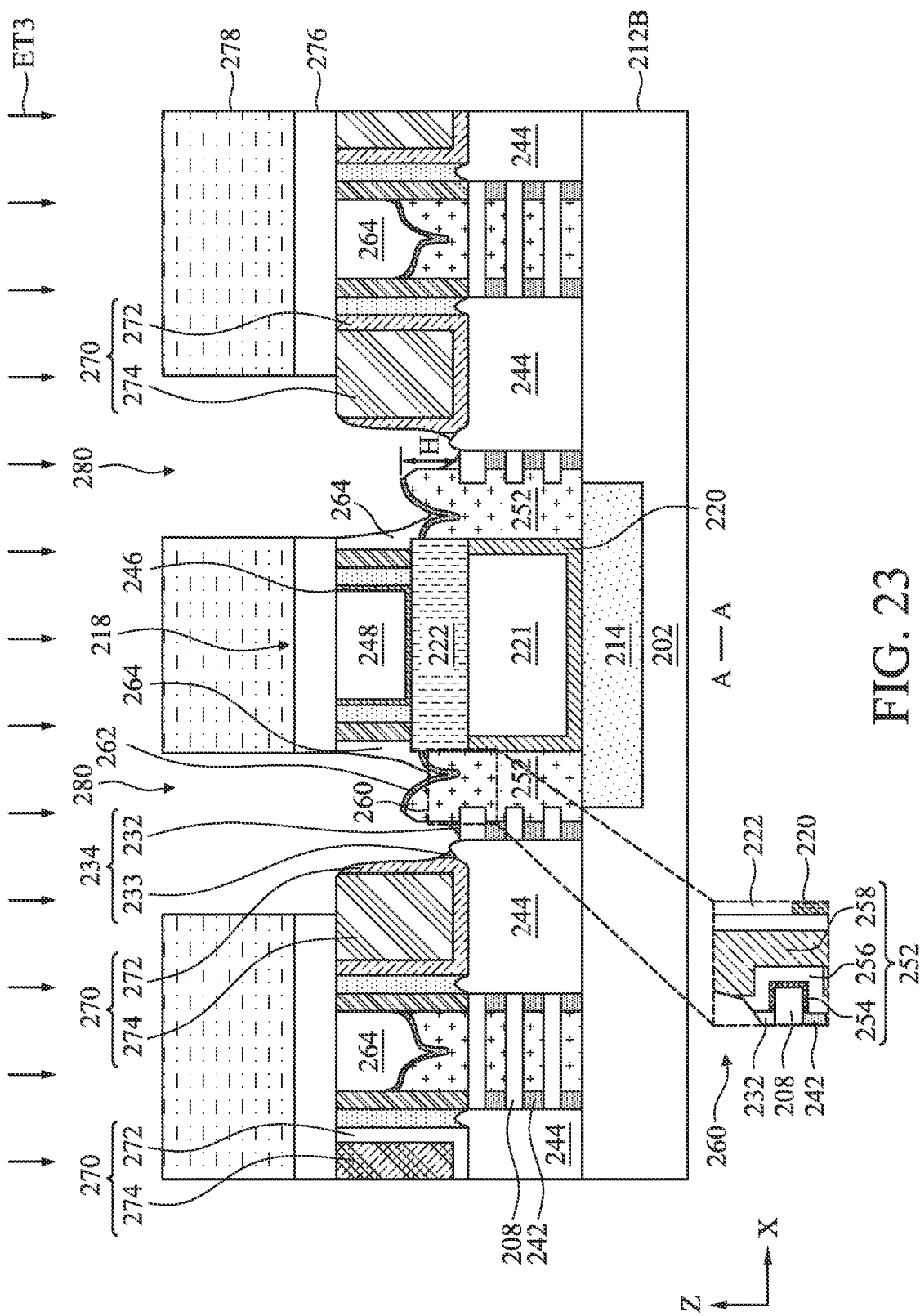

Referring to FIGS. 4 and 23, method 100 includes a block 138 where the contact openings 280 are extended downward into the gate spacers 234 by using a third etch process (denoted as ET3). The duration of the third etch process ET2 is controlled to partially remove the gate spacers 234, further deepening or extending the contact openings 280 down. In some embodiments, the third etch process ET3 is an anisotropic etch process, e.g., a plasma etch (e.g., Inductively Coupled Plasma (ICP), Capacitively Coupled Plasma (CCP), etc.) using a different etchant and/or etch conditions than the first etch process ET1 and the second etch process ET2. As a result of the third etch process ET3, sidewalls of the contact layer 272 of the source/drain contacts 270 and the sidewalls of the replacement gate structures 252 are exposed at the bottom of the deepened contact openings 280 after the recessing of the gate spacers 234. The SAC caps 264 substantially remain intact in the third etch process ET3 due to its material being different form the gate spacers 234 (first and second spacer layers 232, 233). Further, as illustrated in the region 260 enlarged for clarity, the gate dielectric layer 256 is also partially removed by the third etch process ET3, such that the gate electrode layer 258 (at least one work function layer and/or a metal fill layer) is exposed. A bottom portion of the gate spacers 234 may remain at the bottom of the deepened contact openings 280. In the illustrated embodiment in FIG. 23, the gate spacers 234 are recessed such that a tip of the source/drain features 244 is exposed, accordingly first spacer layer 232 is disconnected from the second spacer layer 233. In some embodiments, the second spacer layer 233 may be fully removed, exposing the whole sidewall of the contact layer 272. Yet, at least a portion of the first spacer layer 232 remains, covering the topmost channel member 208 from being exposed. A distance from the topmost portion of the gate electrode layer 258 to the bottom surface of the deepened contact openings 280, denoted as H, may range from about 2 nm to about 6 nm. If the distance H is less than about 2 nm, not enough sidewalls of the source/drain contacts 270 and the sidewalls of the replacement gate structures 252 are exposed such that the contact resistance for the to-be-formed butted contact would still be large. If the distance H is larger than about 6 nm, the contact openings 280 is over-deepened, risking the topmost channel member 208 being exposed and causing electric shorting. The gate electrode layer 258 can act as a detectable etch endpoint, which in turn prevents over-deepening the contact openings 280. The sidewalls of the contact layer 272 of the source/drain contacts 270 exposed in the contact openings 280 may have a tapered sidewall profile.

Figure 24:
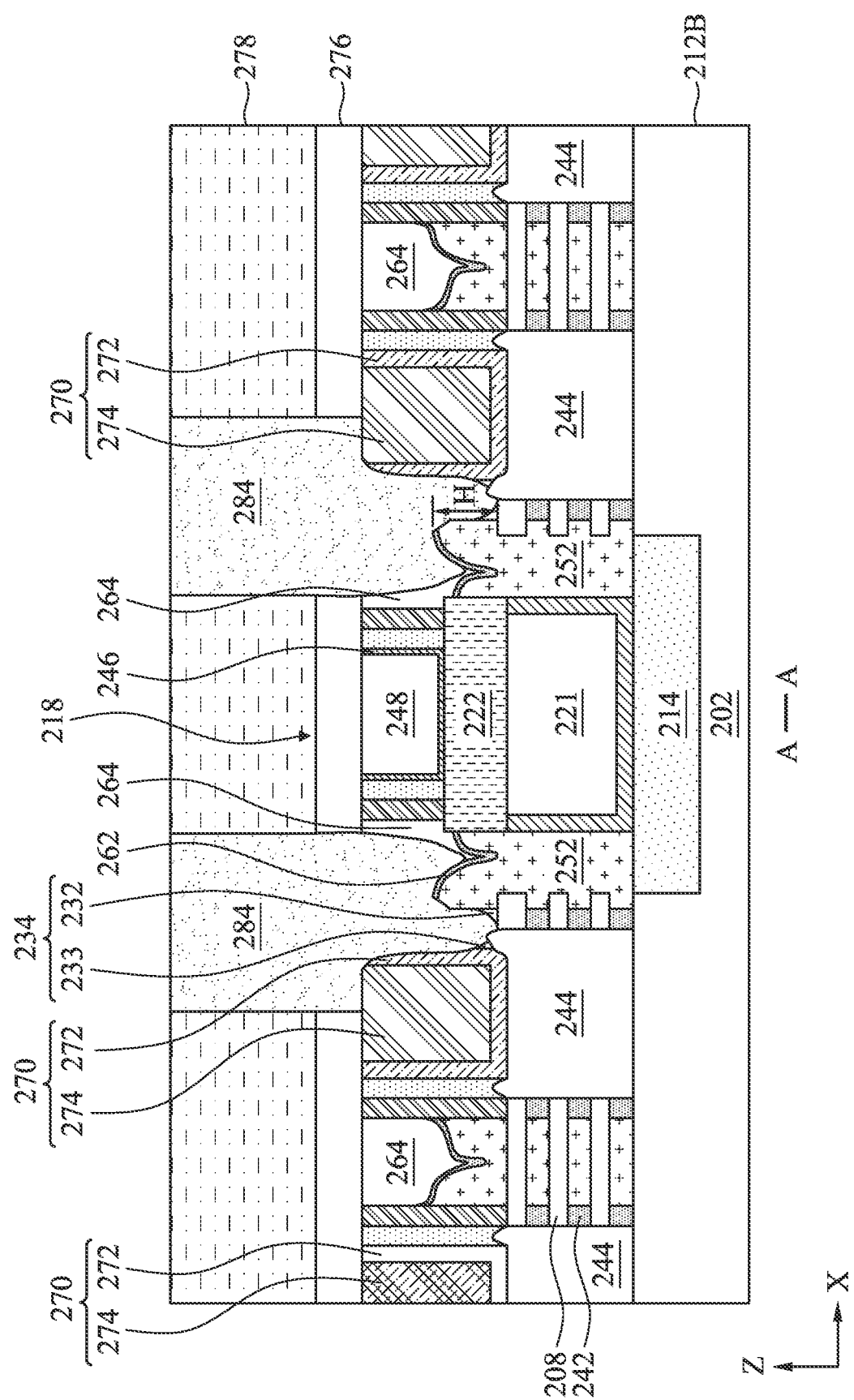
Figure 25:
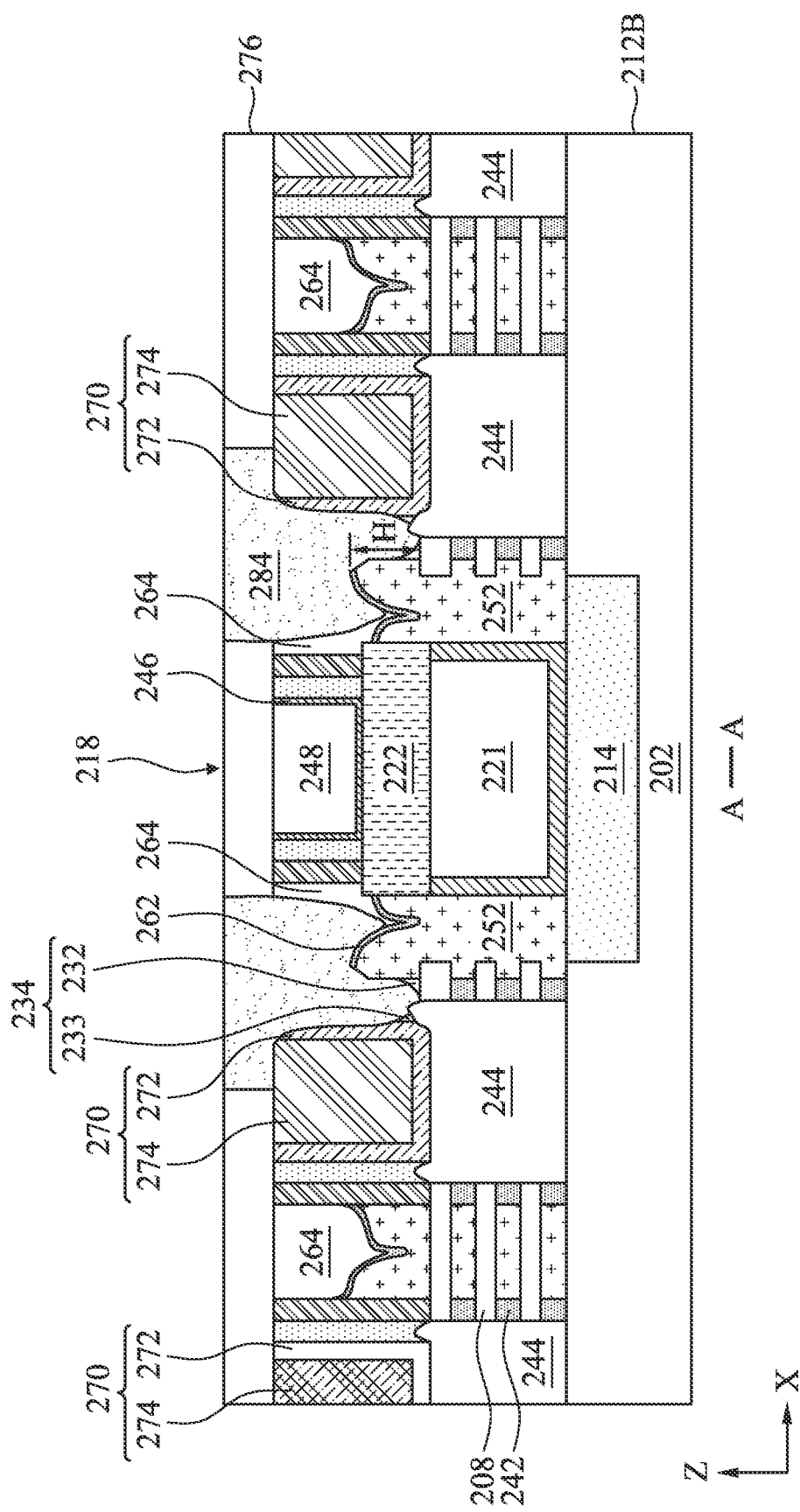

Referring to FIGS. 4 and 24-25, method 100 includes a block 140 where butted contacts 284 are then formed in the contact openings 280 to form physical and electrical connections to the gate structure 252 and the source/drain contacts 270. By way of example and not limitation, the butted contacts 284 are formed using: one or more metal materials overfilling the contact openings 280 are deposited, followed by a CMP process to remove the excess metal material(s) outside the contact openings 280, including the ILD layer 278. As a result of the CMP process, butted contacts 284 have top surfaces that are substantially coplanar with MCESL 276, as shown in FIG. 25. The butted contacts 284 may include a metal material, such as copper, aluminum, tungsten, or combinations thereof, and the like, and the butted contacts 284 may be formed using PVD, CVD, ALD, or the like. In some embodiments, the butted contacts 284 may also include one or more barrier/adhesion layers (not shown) for protecting the MCESL 276 and the SAC caps 264 from metal diffusion (e.g., copper diffusion). The one or more barrier/adhesion layers may comprise titanium, titanium nitride, tantalum nitride, or the like, and the one or more barrier/adhesion layers may be formed using PVD, CVD, ALD, or the like.

The butted contact 284 inherits the geometry of the contact openings 280. In some embodiments, the butted contact 284 extends through the entire thickness of MCESL 276 with substantially vertical sidewalls, and interfaces with the SAC caps 264 and the source/drain contact 270 with tapered sidewalls. The butted contact 284 interfaces the top surfaces of the source/drain contact 270 and the gate structure 252. The butted contact 284 also has an extending portion that extends downwardly to a position laterally between the source/drain contact 270 and the gate structure 252. The extending portion of the butted contact 284 interfaces the sidewalls of the source/drain contact 270 and the gate structure 252, providing extra contact area, such as about 20% to about 40% extra contact area in some examples. The extra contact area reduces contact resistance between the source/drain contact 270 and the gate structure 252. Further, the etching of the gate spacers 234 has a self-aligned manner, such that even there is overlying inaccuracy occurs, resulting in butted contact 284 to be misaligned with a top surface of the source/drain contact 270 (or the gate structure 252), the extending portion of the butted contact 284 would still interface with sidewalls of the source/drain contact 270 (or the gate structure 252), ensuring some contact.

In the illustrated embodiment in FIG. 25, the extending portion of the butted contact 284 also interfaces with the tip of the source/drain feature 244 and the residues of the first and second spacer layers 232, 233. Due to the uneven top surface of the gate structure 252, the butted contact 284 may have a second extending portion above the dip of the top surface of the gate structure 252. In other words, the bottom surface of the butted contact 284 straddles the topmost portion of the gate structure 252. The residue of the first spacer layer 232 isolates the topmost channel member 208 from contacting the butted contact 284.

Figure 26:
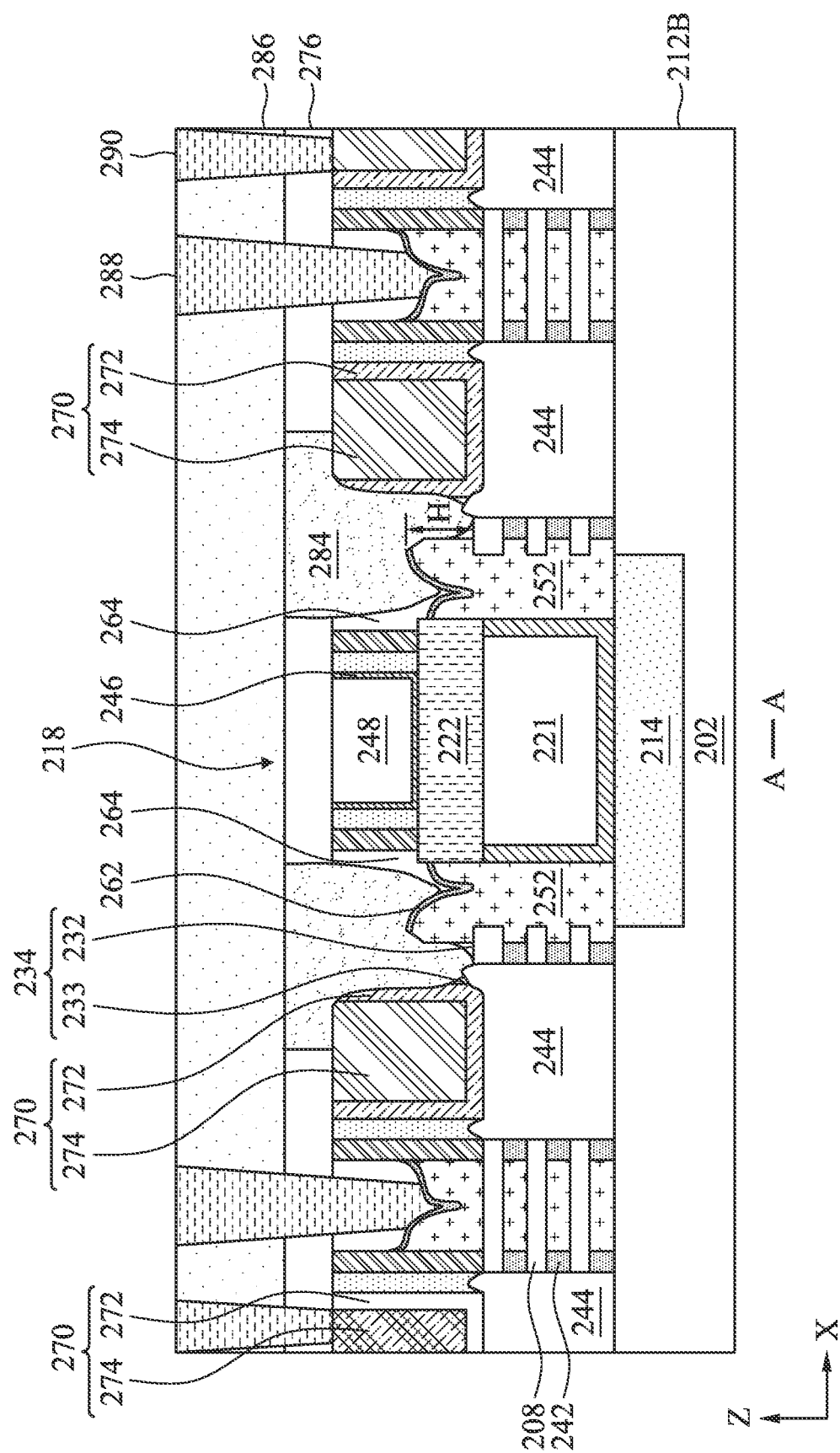

Referring to FIGS. 4 and 26, method 100 includes a block 142 where the workpiece 200 may undergo further processing to form various features and regions known in the art. For example, subsequent processing may form an intermetal dielectric (IMD) layer 286 over the MCESL 276 and form via openings, vias, as well as various contacts/vias/lines and multilayers interconnect features (e.g., metal layers and interlayer dielectrics), configured to connect the various features to form a functional circuit that may include one or more multi-gate devices. In furtherance of the example, a multilayer interconnection may include vertical interconnects, such as vias or contacts, and horizontal interconnects, such as metal lines. As illustrated in FIG. 26, gate vias 288 and source/drain contact vias 290 are formed to connect the gate structures and source/drain features to above metal lines, such as bit lines and word lines in the context of SRAM cells. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 27:
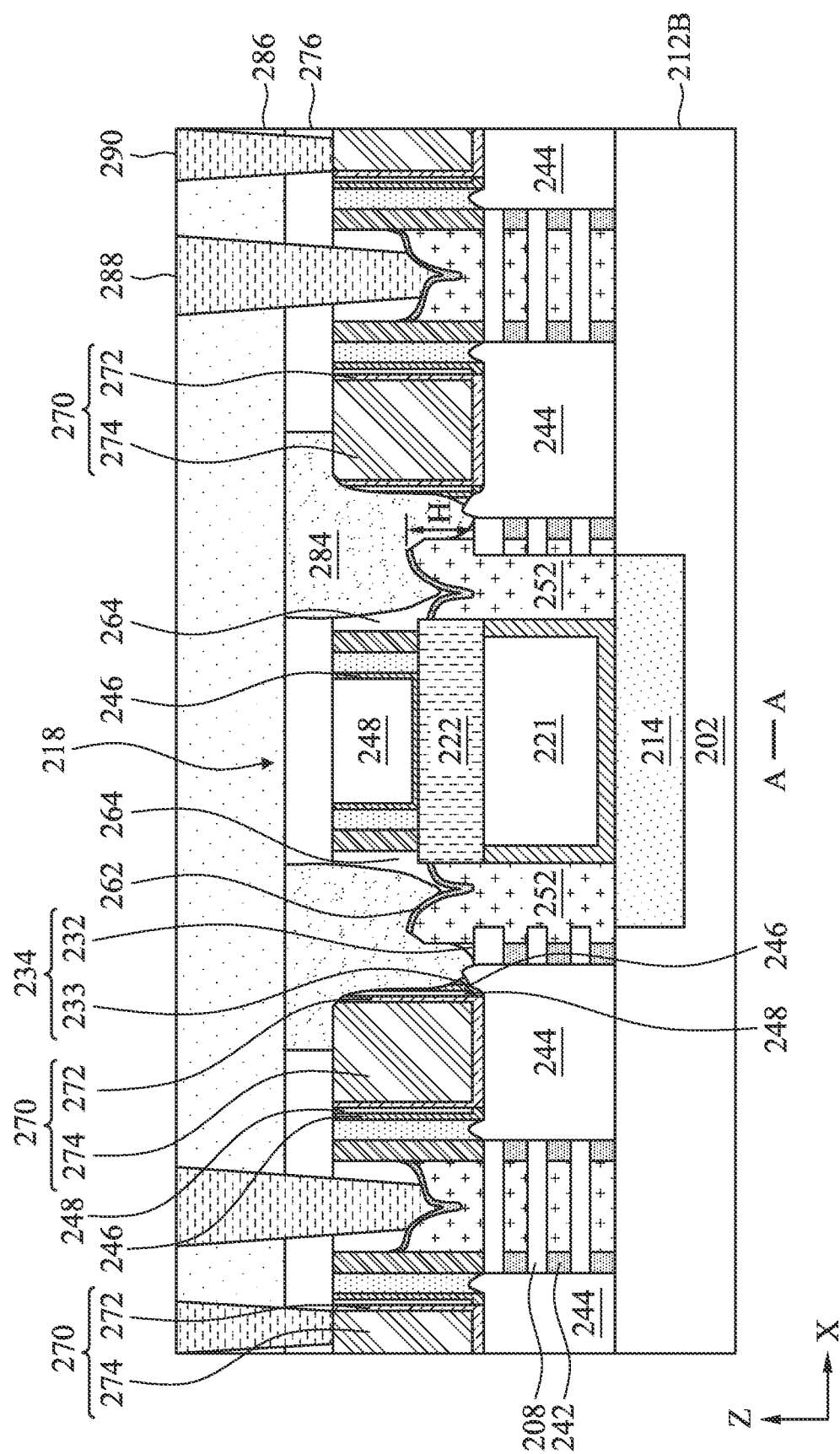

The reference is made to FIG. 27. In an alternative embodiment, method 100 at block 130 may form source/drain contacts 270 surrounded by the ILD layer 248 and the CESL 246, such as by applying a lithography process to create contact openings in the ILD layer 248 and through the CESL 246. After the third etch process ET3 at block 138, residue portions of the ILD layer 248 and the CESL 246 may remain under the butted contact 284 and laterally between the contact layer 272 and the second spacer layer 233.

Figure 28:
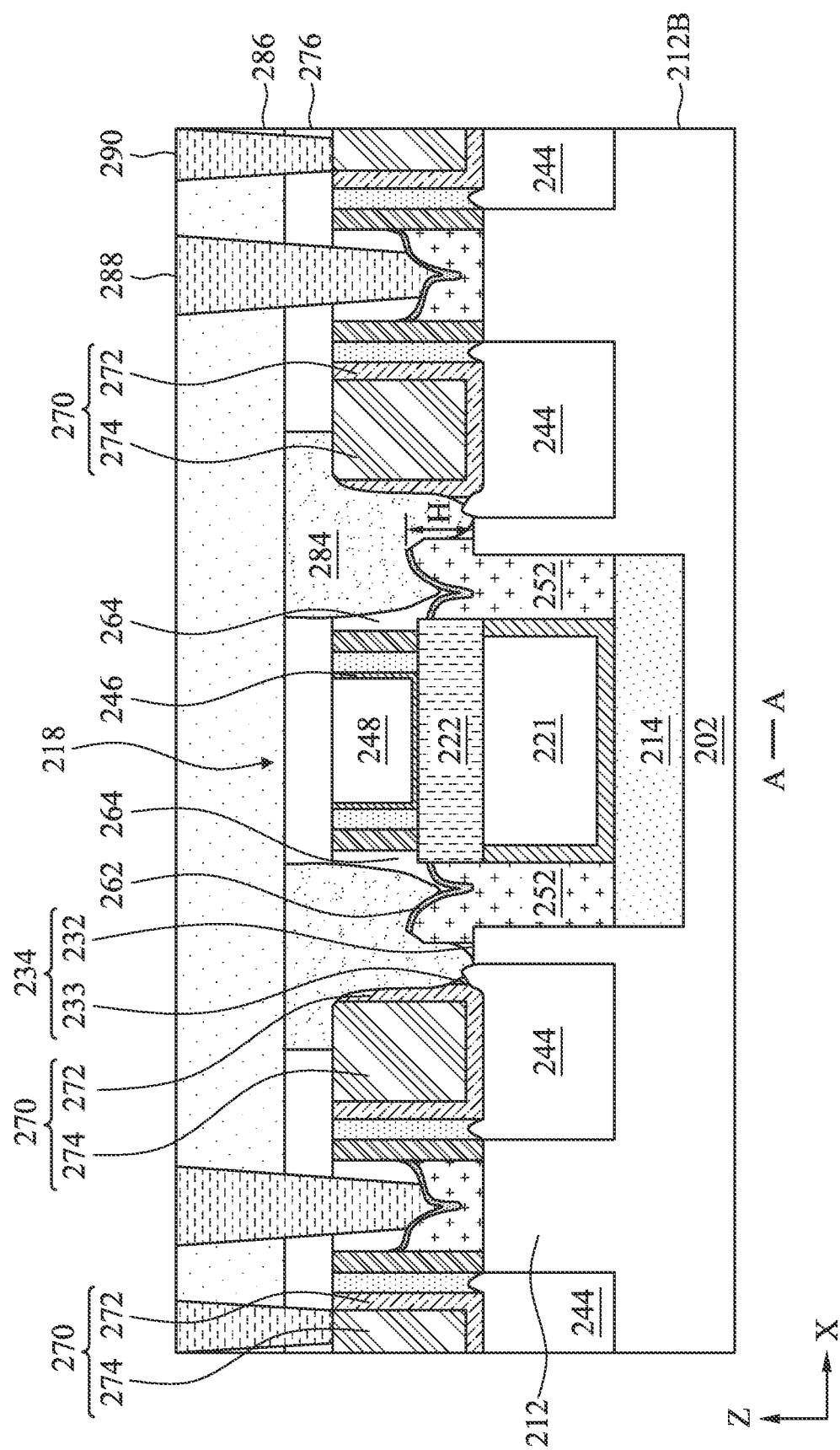

The reference is made to FIG. 28. One of ordinary skill may recognize although FIGS. 5-27 illustrate GAA devices as embodiments, other examples of semiconductor devices may benefit from aspects of the present disclosure, such as FinFET devices. As depicted in FIG. 28, in FinFET devices, the fin-shaped structures 212 (or semiconductor fins) provide channel regions for the transistors other than the vertically stacked channel members 208 as in MBC devices. For reasons of clarity and consistency, similar elements appearing in FIG. 28 are labeled the same as in FIGS. 5-27, and the details of these elements are not necessarily repeated again.

Although not intended to be limiting, one or more embodiments of the present disclosure provide many benefits to a semiconductor device and the formation thereof. For example, embodiments of the present disclosure provide a butted contact to connect a source/drain contact to a gate structure. The butted contact includes an extending portion that downwardly extends to laterally between the gate structure and the source/drain contact. The extending portion provides extra contacting surface on sidewalls of the gate structure and the source/drain contact, in addition to top surfaces of the gate structure and the source/drain contact. The extra contacting surface effectively reduces contact resistance and provides a low impedance path between the gate structure and the source/drain contact. Furthermore, the formation of the butted contact can be easily integrated into existing semiconductor fabrication processes.

In one exemplary aspect, the present disclosure is directed to a method. The method includes forming a fin-shaped structure protruding from a substrate, forming a gate structure intersecting the fin-shaped structure, forming a gate spacer on a sidewall of the gate structure, forming a conductive feature above the fin-shaped structure, the gate spacer being laterally between the gate structure and the conductive feature, depositing a dielectric layer over the gate structure and the conductive feature, performing an etching process, thereby forming an opening through the dielectric layer, top surfaces of the conductive feature and the gate structure being exposed in the opening, recessing the gate spacer through the opening, thereby exposing the sidewall of the gate structure, and forming a contact feature in the opening, wherein the contact feature is in contact with the conductive feature and has a bottom portion protruding downward to be in contact with the sidewall of the gate structure. In some embodiments, the contact feature has an extending portion laterally between the conductive feature and the gate structure. In some embodiments, the method further includes growing an epitaxial feature on the fin-shaped structure and adjacent the gate structure, the conductive feature landing on the epitaxial feature. In some embodiments, after the recessing of the gate spacer, a portion of the epitaxial feature is exposed in the opening. In some embodiments, after the recessing of the gate spacer, a sidewall of the conductive feature is exposed in the opening. In some embodiments, the contact feature is in contact with the sidewall of the conductive feature. In some embodiments, the method further includes recessing the gate structure, and depositing a dielectric capping layer on the recessed gate structure, the performing of the etching process removing a portion of the dielectric capping layer. In some embodiments, the fin-shaped structure lengthwise terminates at an end surface, and the gate structure interfaces the end surface of the fin-shaped structure. In some embodiments, the fin-shaped structure includes a plurality of channel layers interleaved by a plurality of sacrificial layers, the method further includes selectively removing the sacrificial layers, thereby releasing the channel layers, the gate structure wrapping around each of the channel layers. In some embodiments, a top surface of the contact feature is coplanar with a top surface of the dielectric layer.

In another exemplary aspect, the present disclosure is directed to a method. The method includes forming a fin-shaped structure extending lengthwise along a first direction, the fin-shaped structure lengthwise terminating at an end surface, depositing a cladding layer interfacing the end surface, depositing a fin spacer on a sidewall of the cladding layer, depositing a dielectric layer on the fin-shaped structure, recessing a source/drain region of the fin-shaped structure to form a source/drain recess, depositing a source/drain feature in the source/drain recess, forming a source/drain contact on the source/drain feature, replacing the cladding layer with a gate structure, the gate structure extending lengthwise along a second direction perpendicular to the first direction and interfacing the end surface, and the dielectric layer being sandwiched by the source/drain contact and the gate structure, recessing the dielectric layer, thereby forming an opening, and depositing a contact feature in the opening, the contact feature being in contact with the source/drain contact and the gate structure. In some embodiments, the dielectric layer is deposited on a sidewall of the gate structure. In some embodiments, the opening exposes sidewalls of the source/drain contact and the gate structure, and the contact feature is in contact with the sidewalls of the source/drain contact and the gate structure. In some embodiments, the gate structure includes a gate dielectric layer and a gate electrode layer, and the recessing of the dielectric layer also partially removes the gate dielectric layer and exposes the gate electrode layer in the opening. In some embodiments, after the recessing of the dielectric layer, a portion of the dielectric layer remains in the opening and covers the fin-shaped structure from exposing in the opening. In some embodiments, the contact feature includes a first portion and a second portion sandwiching a top portion of the gate structure.

In yet another exemplary aspect, the present disclosure is directed to a semiconductor device. The semiconductor device includes first and second fins extending lengthwise in a first direction, and first and second gate structures extending lengthwise in a second direction perpendicular to the first direction. The first gate structure engages the first fin in forming a first transistor, the second gate structure engages the second fin in forming a second transistor, and the second gate structure is in contact with a terminal end of the first fin. The semiconductor device also includes a source/drain feature of the first transistor, a source/drain contact in contact with the source/drain feature, and a contact structure in contact with top surfaces of the source/drain contact and the second gate structure. The contact structure includes an extending portion laterally between sidewalls of the source/drain contact and the second gate structure. In some embodiments, the contact structure is in contact with the sidewalls of the source/drain contact and the second gate structure. In some embodiments, the contact structure is in contact with the source/drain feature. In some embodiments, the semiconductor device further includes a gate spacer in contact with the second gate structure and the extending portion of the contact structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a fin-shaped structure protruding from a substrate; forming a gate structure intersecting the fin-shaped structure; forming a gate spacer on a sidewall of the gate structure;
   after the forming of the gate spacer, growing a source/drain epitaxial feature on the fin-shaped structure and adjacent the gate structure;
   forming a conductive feature interfacing and in electrical coupling with the source/drain epitaxial feature, wherein the gate spacer is laterally between the gate structure and the conductive feature;
   after the forming of the conductive feature, depositing a dielectric layer over the gate structure and the conductive feature;
   performing an etching process, thereby forming an opening through the dielectric layer, wherein top surfaces of the conductive feature and the gate structure are exposed in the opening;
   recessing the gate spacer through the opening, thereby exposing the sidewall of the gate structure, wherein after the recessing of the gate spacer, a portion of the source/drain epitaxial feature is exposed in the opening; and
   forming a contact feature in the opening, wherein the contact feature is in contact with the conductive feature and has a bottom portion protruding downward to be in contact with the sidewall of the gate structure.

2. The method of claim 1, wherein the contact feature has an extending portion laterally between the conductive feature and the gate structure.

3. The method of claim 1, wherein the conductive feature is disposed on a top surface of the source/drain epitaxial feature.

4. The method of claim 1, wherein after the recessing of the gate spacer, a sidewall of the conductive feature is exposed in the opening.

5. The method of claim 4, wherein the contact feature is in contact with the sidewall of the conductive feature.

6. The method of claim 1, further comprising:
recessing the gate structure, thereby resulting in a recessed gate structure; and depositing a dielectric capping layer on the recessed gate structure, wherein the performing of the etching process removes a portion of the dielectric capping layer.

7. The method of claim 1, wherein the fin-shaped structure lengthwise terminates at an end surface, and wherein the gate structure interfaces the end surface of the fin-shaped structure.

8. The method of claim 1, wherein the fin-shaped structure includes a plurality of channel layers interleaved by a plurality of sacrificial layers, the method further comprising:
selectively removing the sacrificial layers, thereby releasing the channel layers, wherein the gate structure wraps around each of the channel layers.

9. The method of claim 1, wherein a top surface of the contact feature is coplanar with a top surface of the dielectric layer.

10. A method, comprising:
forming a fin-shaped structure extending lengthwise along a first direction, wherein the fin-shaped structure lengthwise terminates at an end surface;
depositing a cladding layer interfacing the end surface; depositing a fin spacer on a sidewall of the cladding layer; depositing a dielectric layer on the fin-shaped structure;
recessing a source/drain region of the fin-shaped structure to form a source/drain recess;
depositing a source/drain feature in the source/drain recess;
forming a source/drain contact on the source/drain feature;
replacing the cladding layer with a gate structure, wherein the gate structure extends lengthwise along a second direction perpendicular to the first direction and interfaces the end surface, and wherein the dielectric layer is sandwiched by the source/drain contact and the gate structure;
recessing the dielectric layer, thereby forming an opening; and
depositing a contact feature in the opening, wherein the contact feature is in contact with the source/drain contact and the gate structure.

11. The method of claim 10, wherein the dielectric layer is disposed on a sidewall of the gate structure.

12. The method of claim 10, wherein the opening exposes sidewalls of the source/drain contact and the gate structure, and wherein the contact feature is in contact with the sidewalls of the source/drain contact and the gate structure.

13. The method of claim 10, wherein the gate structure includes a gate dielectric layer and a gate electrode layer, and wherein the recessing of the dielectric layer also partially removes the gate dielectric layer and exposes the gate electrode layer in the opening.

14. The method of claim 10, wherein after the recessing of the dielectric layer, a portion of the dielectric layer remains in the opening and covers the fin-shaped structure from exposing in the opening.

15. The method of claim 10, the contact feature includes a first portion and a second portion sandwiching a top portion of the gate structure.

16. A method, comprising:
forming a fin-shaped structure protruding from a substrate;
forming a dummy gate stack directly above an edge of the fin-shape structure; depositing a gate spacer on a sidewall of the dummy gate stack;
forming a source/drain feature on the fin-shaped structure; replacing the dummy gate stack with a metal gate structure;
forming a source/drain contact on the source/drain feature, wherein the gate spacer is laterally between the source/drain contact and the metal gate structure;
depositing a dielectric layer over the source/drain contact and the metal gate structure; forming an opening through the dielectric layer, wherein the opening exposes top surfaces of the source/drain contact and the gate spacer;
after the forming of the source/drain contact and the forming of the opening, recessing the gate spacer through the opening to expose sidewalls of the source/drain contact and the metal gate structure; and
depositing a butted contact in the opening, wherein the butted contact interfaces the sidewalls of the source/drain contact and the metal gate structure, wherein the butted contact interfaces the source/drain feature.

17. The method of claim 16, wherein the fin-shaped structure includes a plurality of channel layers and a plurality of sacrificial layers interleaved with each other, the method further comprising:
recessing the sacrificial layers from the edge of the fin-shaped structure to form inner spacer cavities;
depositing inner spacers in the inner spacer cavities; and
removing the sacrificial layers.

18. The method of claim 16, further comprising:
prior to the depositing of the dielectric layer, recessing the metal gate structure to expose a sidewall of the gate spacer; and
depositing a gate dielectric capping layer over the recessed metal gate structure, wherein the gate dielectric capping layer interfaces the sidewall of the gate spacer, and wherein forming of the opening at least partially removes the gate dielectric capping layer and exposes the sidewall of the gate spacer.

19. The method of claim 1, further comprising:
forming inner spacers interposing the source/drain epitaxial feature and the gate structure.

20. The method of claim 16, wherein a top surface of the butted contact is coplanar with a top surface of the dielectric layer.

* * * * *